(12) United States Patent
Krishnaswamy et al.

(10) Patent No.: US 7,848,719 B2
(45) Date of Patent: Dec. 7, 2010

(54) ULTRA-WIDEBAND VARIABLE-PHASE RING-OSCILLATOR ARRAYS, ARCHITECTURES, AND RELATED METHODS

(75) Inventors: Harish Krishnaswamy, Los Angeles, CA (US); Hossein Hashemi, Los Angeles, CA (US)

(73) Assignee: University of Southern California, Los Angeles, CA (US)

( * ) Notice: Subject to any disclaimer, the term of this patent is extended or adjusted under 35 U.S.C. 154(b) by 355 days.

(21) Appl. No.: 12/131,805

(22) Filed: Jun. 2, 2008

(65) Prior Publication Data

US 2008/0297414 A1    Dec. 4, 2008

Related U.S. Application Data

(63) Continuation-in-part of application No. 11/748,394, filed on May 14, 2007.

(60) Provisional application No. 60/941,338, filed on Jun. 1, 2007.

(51) Int. Cl.
*H03J 7/32* (2006.01)

(52) U.S. Cl. ............................ 455/147; 455/86; 455/85; 455/141; 327/105; 327/156; 375/372

(58) Field of Classification Search ................. 455/147, 455/86, 85, 143, 146, 195.1, 196.1, 208, 455/209, 255, 258, 259, 264; 327/105, 156; 375/372
See application file for complete search history.

(56) References Cited

U.S. PATENT DOCUMENTS

| | | | | |
|---|---|---|---|---|
| 3,581,212 A | * | 5/1971 | McMurray | 327/105 |
| 3,886,472 A | * | 5/1975 | Cottatellucci | 331/12 |
| 5,345,186 A | * | 9/1994 | Lesmeister | 327/105 |
| 5,450,041 A | * | 9/1995 | Halladay et al. | 331/96 |
| 5,751,775 A | * | 5/1998 | Fensch et al. | 375/371 |
| 5,917,383 A | * | 6/1999 | Tso et al. | 331/57 |
| 6,104,326 A | * | 8/2000 | Lee et al. | 341/68 |
| 6,297,704 B1 | * | 10/2001 | Nicholls et al. | 331/34 |
| 6,369,661 B1 | * | 4/2002 | Scott et al. | 331/45 |
| 6,711,227 B1 | * | 3/2004 | Kaylani et al. | 375/372 |
| 6,737,926 B2 | * | 5/2004 | Forbes | 331/57 |
| 6,924,677 B2 | * | 8/2005 | Lee | 327/147 |
| 6,980,061 B2 | * | 12/2005 | Takada et al. | 331/107 A |
| 6,989,697 B2 | * | 1/2006 | Dimmler et al. | 327/156 |
| 6,993,107 B2 | * | 1/2006 | Cranford et al. | 375/376 |
| 7,046,096 B2 | * | 5/2006 | Kobayashi | 331/135 |
| 7,050,522 B2 | * | 5/2006 | Schmatz | 375/371 |
| 7,102,450 B2 | * | 9/2006 | Forbes | 331/57 |
| 7,142,624 B2 | * | 11/2006 | Cranford et al. | 375/376 |
| 7,301,392 B2 | * | 11/2007 | Hinrichs et al. | 327/553 |
| 7,394,884 B2 | * | 7/2008 | Kaylani et al. | 375/372 |
| 7,541,864 B2 | * | 6/2009 | Rasmussen | 330/10 |
| 7,663,328 B2 | * | 2/2010 | Gonder | 318/400.17 |

(Continued)

*Primary Examiner*—Minh D Dao
(74) *Attorney, Agent, or Firm*—McDermott Will & Emery LLP

(57) ABSTRACT

Variable phase ring oscillators are described that provide a linear phase progression between adjacent elements in an antenna array by providing a symmetric ring configuration of tuned amplifiers and a single phase shifter. The ring topology is coupled to a single PLL that allows for direct modulation and demodulation of arbitrary waveforms without using RF up/down converting mixers. The PLL distributes the transmit waveforms to all antenna elements in the transmit mode and combines the received waveforms in the receive mode without any complicated power distribution network. Ultra-wideband architectures and methods are described that utilize a first reference signal source, a VPRO, and a second reference signal source. Related methods are controlling an array and beam steering are also described.

24 Claims, 22 Drawing Sheets

U.S. PATENT DOCUMENTS

| | | | |
|---|---|---|---|
| 2002/0009170 A1* | 1/2002 | Schmatz | 375/371 |
| 2002/0175729 A1* | 11/2002 | Cyrusian | 327/274 |
| 2003/0052723 A1* | 3/2003 | Forbes | 327/295 |
| 2003/0067357 A1* | 4/2003 | Lin et al. | 331/17 |
| 2003/0067360 A1* | 4/2003 | Takada | 331/107 SL |
| 2004/0165690 A1* | 8/2004 | Kaylani et al. | 375/372 |
| 2004/0233008 A1* | 11/2004 | Kobayashi | 331/135 |
| 2005/0012557 A1* | 1/2005 | Forbes | 331/135 |
| 2005/0156641 A1* | 7/2005 | Dimmler et al. | 327/156 |
| 2006/0121933 A1* | 6/2006 | Ikeda | 455/550.1 |
| 2006/0232346 A1* | 10/2006 | Ouici | 331/57 |
| 2006/0290436 A1* | 12/2006 | Forbes | 331/57 |
| 2007/0040622 A1* | 2/2007 | Park | 331/57 |
| 2008/0001660 A1* | 1/2008 | Rasmussen | 330/10 |
| 2009/0104885 A1* | 4/2009 | Asayama et al. | 455/296 |
| 2009/0153085 A1* | 6/2009 | Gonder | 318/400.17 |

* cited by examiner

FIG. 16(a)
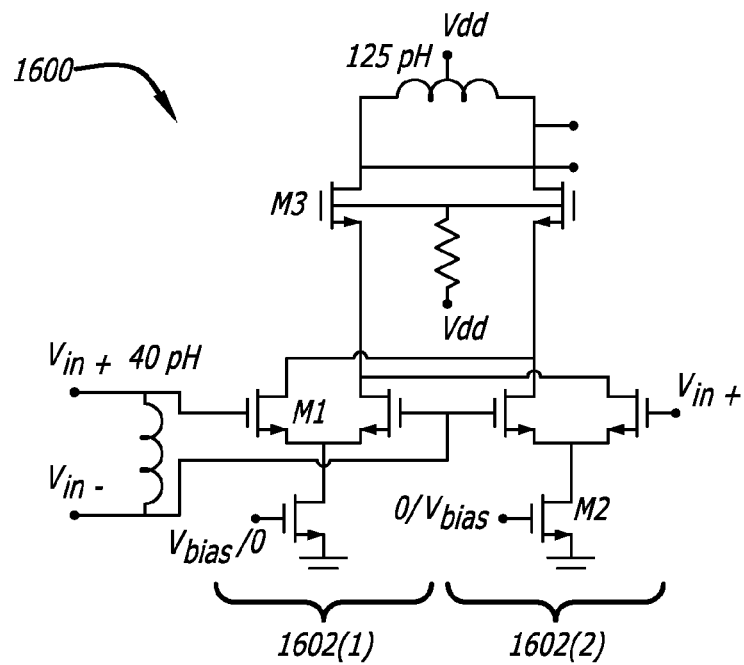
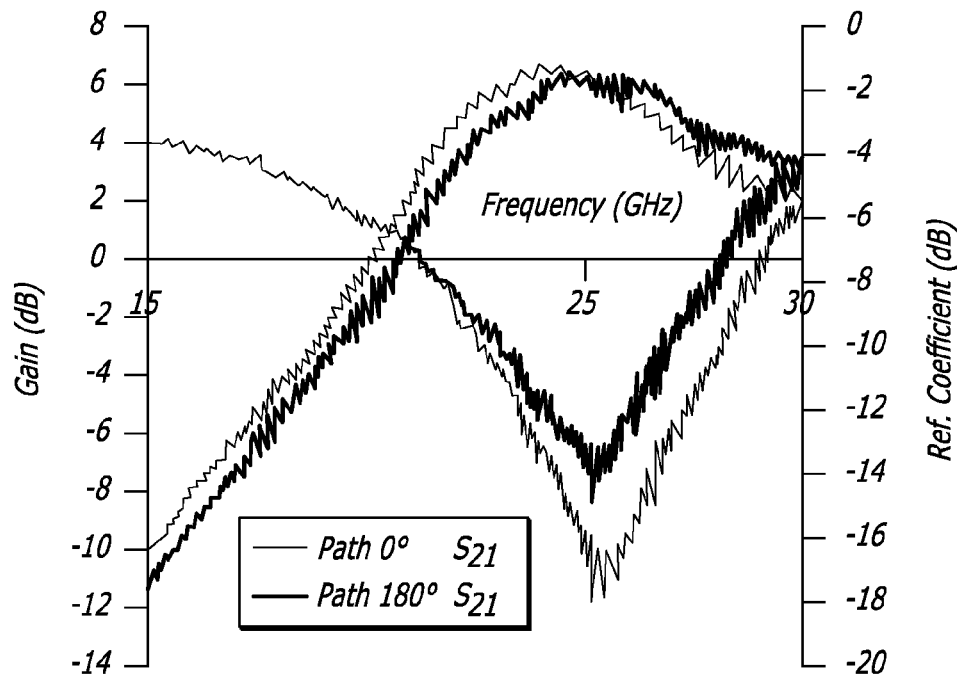
FIG. 16B

ND VARIABLE-PHASE
ULTRA-WIDEBAND VARIABLE-PHASE RING-OSCILLATOR ARRAYS, ARCHITECTURES, AND RELATED METHODS

RELATED APPLICATIONS

This application is a continuation-in-part of U.S. application Ser. No. 11/748,394 filed 14 May 2007, which claims priority to U.S. Provisional Application No. 60/747,150 filed 12 May 2006; the contents of both of which applications are incorporated herein by reference in their entireties; additionally, this application claims priority to U.S. Provisional Application No. 60/941,338 filed 1 Jun. 2007, the entire contents of which are incorporated herein by reference.

STATEMENT REGARDING FEDERALLY SPONSORED RESEARCH

This invention was made with government support under Contract No. ECS-0621874, awarded by the National Science Foundation. The government has certain rights in the invention.

BACKGROUND

Phased arrays are systems of multiple spatially diverse (spaced apart) antennas (a/k/a antenna arrays) that can focus signal energy into a narrow beam radiating into/from specific directions and electronically change the direction of signal transmission and reception. These beam forming schemes reduce the interference levels by placing a null in undesired directions, increase the effective SNR, and conserve the battery power by focusing the energy only at desired directions. Phased arrays have been used for radar, imaging, and communications in military, space, medical, and commercial applications due to their ability to form electronically steerable beams. Phased arrays have been limited to discrete implementations where physically separated antennas are connected to their associated electronics (separate electronics for each antenna). This approach leads to an increase in system cost, size, and power consumption.

Phased arrays, also known as electronically steered arrays (ESA), imitate the behavior of directional antennas whose bearing can be adjusted electrically. They use multiple spaced antennas and can shape the transmitted or received electromagnetic beam (beam forming). In phased array receivers, the incident wave reaches spatially apart antenna elements at different times. This time delay difference is a function of antenna spacing and angle of arrival. The receiver compensates for these time delays and combines all the signals to enhance the reception from the desired direction, while rejecting emissions from other directions (spatial selectivity). The coherent addition of signal and the uncorrelated nature of noise in these systems improve the output signal-to-noise ratio by the array size.

Phased array transmitters provide appropriate time delay for the signal at each antenna element so that the radiated electromagnetic beam from the array has the intended shape (e.g., pointed to a specific angle). When a linear array of uniformly spaced antennas receives a plane electromagnetic wave, each antenna receives a successively-time-delayed version of the signal, with the inter-element delay depending on the inter-antenna separation and the angle of incidence of the wave. The signal can then be recovered with maximum power gain by compensating for the inter-element delay electronically in the receiver. Consequently, exercising electronic control over the time-delay in each antenna's signal path allows one to "look" for electronic beams in different directions.

The design of any high performance integrated communication system begins with the transceiver architecture. Phased arrays and transmit/receive spatial diversity systems are the main applications of multiple antenna transceivers. Phased arrays imitate the behavior of directional antennas whose bearing can be adjusted electrically. They compensate the time delay differences of the radiated signal between the antenna elements, and combine the signals to enhance the reception from the desired direction, while rejecting emissions from other directions. The coherent addition of signal and the uncorrelated nature of noise in these systems improve the output SNR by the array size. Providing the delayed version of the transmitted or received signal is a common unique feature of various multiple antenna schemes. In narrowband implementations, this time delay can be approximated with a constant phase shift. This approximation does not hold as the signal bandwidth gets larger and causes signal distortion. Controlling the signal time delay in each path of a phased-array radio can be achieved by various methods involving multiple trade-offs in the performance of phased-array systems. Additionally, the amplitude of each path in multiple antenna systems can be individually controlled in order to increase the SNR and reduce the gain at undesired incident angles (controlling side-lobe levels and null location in the EM beam pattern).

FIG. 1 includes FIGS. 1(a)-1(b), which show two conventional approaches 100a and 100b to phase shifting and power combining in the signal path for a phased array of antenna 106(1)-106(N) coupled to amplifiers 102(1)-102(N). In narrowband systems such as shown in FIG. 1(a(, the most straightforward method of adjusting the signal time delay is by providing a variable phase shifter 104(1)-104(N) at the bandwidth of interest in each signal-path. The loss inevitable with most integrated variable RF phase shifters reduces the receiver sensitivity and the transmitter radiated power. Active implementations of RF phase shifters can eliminate loss at the expense of increased nonlinearity and power consumption. However, by phase shifting and signal combining at RF, more radio blocks are shared resulting in reduced area and power consumption. Additionally, since the unwanted interference signals are cancelled after signal combining, e.g., by combiner 108, the dynamic-range requirements of the following blocks (both linearity and noise figure) such as mixer 110 coupled to local oscillator 112 and A/D 114, are more relaxed. If amplitude control is needed, it can be achieved by variable-gain low-noise amplifiers before or after the phase shifters at RF.

As depicted in FIG. 1(b), phase shifting and signal combining can also be performed after down-converting the received signals to an intermediate-frequency (IF). In FIG. 1(b), amplifiers 152(1)-152(N) are coupled to antennas 156(1)-156(N). A mixer 158(1)-158(N) connected each amplifier 152(1)-152(N) to a phase shifter 154(1)-154(N) after mixing with a local oscillator 160. The phase shifter are connected to a combiner 162, which in turn is coupled to A/D 164.

With continued reference to FIG. 1(b), due to the additional signal amplification at the RF stages, phase shifter loss will have a less deteriorating effect on receiver sensitivity in case it is performed at the IF stage, However, some of the aforementioned advantages, including a lower dynamic-range requirement for the RF mixer, become less effective. Moreover, the value of passive components needed to provide a certain phase shift is inversely proportional to the carrier frequency. Since the value of integrated passive components is directly related to their physical size, passive phase shifters at IF consume a larger area.

In wideband systems, a true variable time delay element should be places in each signal path. For example, elements 104(1)-104(N) in FIG. 2(a) could be replaced with true variable time delay elements. The time delay of an EM wave can be varied by either changing the propagation velocity, altering length of signal propagation, or a combination of them.

FIG. 2 includes FIGS. 2(a)-2(b), which show two alternative conventional approaches 200a and 200b to phase shifting and power combining for a phased array. As shown in FIG. 2(a), phase shifting can be accomplished in the local-oscillator (LO) path. The phase of the received signal can indirectly be varied by adjusting the phase of local-oscillator signal used to down-convert the signal to a lower frequency. This is due to the fact that the output phase of a multiplier (or mixer) is a linear combination of its input phases. FIG. 2(a) shows a simplified phase-array receiver that uses LO phase shifting. Amplifiers 202(1)-202(N), mixers 204(1)-204(N), antennas 206(1)-206(N), and phase shifters 208(1)-208(N) are configured as shown. A local oscillator 210 is used in conjunction with combiner 212 and A/D 214.

Phase shifting at the LO port is advantageous in that the phase shifter loss and nonlinearity does not directly deteriorate the receiver dynamic range or transmitter radiated power. However, since the undesired interferences are only rejected after the combining step at the IF, RF amplifiers and mixers need to have a higher dynamic range compared to the ones in the signal-path phase shifting scheme. The increased number of building blocks might also increase the chip area and power consumption of the receiver. The control of signal amplitude can be made possible more easily with IF variable-gain amplifiers (VGA). It should be reminded that since the frequency of the local oscillator is fixed, the exact path delay can be maintained for only a single RF frequency. In other words, LO phase shifting is not an efficient solution for wide-band RF signals.

FIG. 2(b) depicts a digital array architecture used for a conventional phased array application. The delay and amplitude of the received signal can be adjusted at the baseband using a digital processor, as shown in FIG. 2(b). In FIG. 2(b), LO 250 is applied to mixers 252(1)-252(N) configured between amplifiers 250(1)-250(N) and A/D 256(1)-256(N). Amplifiers 250(1)-250(N) are connected to antennas 254(1)-254(N). DSP 260 is connected to A/D 256(1)-256(N) as shown.

Digital array architectures such as shown in FIG. 2(b) can be very flexible and can be adapted for other multiple antenna systems used for spatial diversity such as multiple-input multiple-output (MIMO) schemes. Despite its potential versatility, baseband phased-array architecture uses a larger number of components compared to the previous two approaches, resulting in a larger area, more power consumption, and higher system complexity and cost. At the same time, since the interference signals are not cancelled before baseband processing, all the circuit blocks, including the power-hungry analog-to-digital converters (ADC), need to have a large dynamic range to accommodate all the incoming signals without distortion. Above all, handling and processing a large amount of data through multiple parallel receivers can be challenging even for today's advanced digital technology. An illustrative example is shown in FIG. 2(b), where a baseband data-rate of 1.92 Gb/s is required. As a comparison, the fastest rate for sending the data into a personal computer using today's PCI standard is 32 bits×33 MHz=1.056 Gb/s. This rate is almost halved when notebook computers are used (e.g., IEEE1394 standard supports 400 Mb/s). Alternatively, a very powerful digital signal processing (DSP) core can be used to process this large influx of data, but it is going to be bulky, power-hungry, and expensive in today's technology.

In short, until faster and more power efficient digital data processing becomes available at a lower price, digital implementations still is not an optimum solution for low-cost low-power multiple-antenna systems in hand-held applications (e.g. personal RADAR) or in sensory networks.

In addition to the aforementioned conventional approaches, coupled oscillator array have been utilized. In such, a linear array of identical second-order oscillators were each oscillator is coupled to its neighboring oscillators has a stable steady state response: all oscillators generate a sinusoid signal with the same frequency and phase. Upon manually controlling the phase of boundary oscillators, all oscillators will still generate the same frequency but with a linear phase progression from one end to the other end. In a linear narrow-band phased array, the EM plane wave radiates from adjacent antenna elements with a linear phase difference. Therefore, coupled oscillator arrays are attractive solution to phased array implementations without using explicit phase shifters. The simple nearest neighbor coupling of oscillators intended for a phased array application has serious drawbacks in practical implementations. Due to unavoidable mismatches in any implementation, the free running frequencies of integrated oscillators in an array are unequal and can vary by at least 1%. This seemingly small random frequency variation is sufficient to cause a significant undesired phase shift. The desired phase shift between adjacent coupled oscillators have been set by (i) manually tuning the free running frequency of each oscillator, or (ii) by having adding phase locked loops for all adjacent oscillator pairs. The first approach is not suitable for dynamic adjustment of phases for beam steering while the second approach adds to the system cost, complexity, and power consumption.

Phased arrays find wide use in radar, radio astronomy, remote sensing, electronic warfare, spectrum surveillance, wireless communications, and imaging applications. The advantage of phased array systems is more noticeable as the number of elements in the array is increased. However, in conventional architectures, that translates to a significant increase to the size, cost, and power consumption of the overall system. Phased array architectures that reduce the size and power consumption, while preserving the same performance, are highly desirable.

Higher frequencies offer more bandwidth for ultra high data rate wireless communications and better resolution for radar and imaging systems, while reducing the required size of integrated systems in a multi-antenna configuration. Most of the existing phased array systems are implemented using expensive processes and devices such as compound semiconductors. The reduction of minimum feature size in the metal oxide semiconductor (MOS) transistor, accompanied by other rules of scaling has resulted in a more dense integration and higher operation speed at a lower cost for these circuits. Integration of a complete multi-antenna system in a standard low-cost silicon process technology, especially CMOS, results in substantial improvements in cost, size, and reliability and provides numerous opportunities to perform on-chip signal processing and conditioning. Although newer silicon processing technologies offer transistors capable of operation at higher frequencies at a lower power consumption, other issues such as the reduction of power supply, the low quality of integrated passive components, mismatch between integrated components, and multiple sources of noise and interference propagating in a conductive silicon substrate have hindered the proportionate advancement of analog integrated communication circuits at extremely high frequencies. Hence, system architectures and circuit techniques that allow for fully integrated silicon-based phased array solutions at radio-frequency (RF), microwave, and millimeter-waves are very attractive.

In the recent past, the integration of phased array transceivers using silicon-based technologies has aroused a large amount of interest. These efforts are primarily motivated by economics, as silicon-based technologies are far more cost-effective than more exotic technologies. However, the integration of phased array transmitters poses a number of challenges to the analog designer—a simple replication of the signal path for each antenna results in significant area and power consumption.

SUMMARY

The present disclosure provides for a fundamentally different approach to beam-forming by integrating all the radiating elements (antennas) and electronics on a single substrate, e.g., in a single standard silicon wafer. The radiated electromagnetic (EM) field from the silicon wafer is controlled by having several micro-radiators integrated in a closely spaced mesh. These micro-radiators are controlled via integrated electronics that operate at radio frequencies (RF), microwave, and millimeter waves depending on the specific application, In fact, it will be shown that the separation between radiating elements and the RF electronics is very subtle in our proposed scheme: generation of the desired RF beam and radiation occurs in one integrated architecture. The co-design of radiators, RF electronics, and the signal processing core all on the same silicon wafer results in substantial improvements in cost, size, and reliability and opens up numerous possibilities in the DoD application space. The end result of the proposed work is a single silicon wafer connected to source of energy (i.e., battery) that can form arbitrary desired beam(s) for imaging, communication, and radar. As such, it can be used as a compact personal radar, communication device, or sensing element in a collaborative sensory network.

Embodiments of the present disclosure allow for a linear phase progression between adjacent elements in array by providing a symmetric ring configuration of tuned amplifiers and a single phase shifter. This ring topology (or variable phase ring oscillator, "VPRO") is coupled to or includes single (or first) phase-locked loop ("PLL") that allows for direct modulation and demodulation of arbitrary waveforms without using RF up/down converting mixers. In addition, the PLL distributes the transmit waveforms to all antenna elements in the transmit mode and combines the received waveforms in the receive mode without any complicated power distribution network.

When coupled with microwave circuit design techniques, such as transmission-line based design, the new architectures allow for the exploration of the upper frequency limits of standard digital processes.

Thus, embodiments of the present disclosure can allow for the elimination of a number of the building blocks traditionally seen in phased array communication systems, specifically delay-elements, mixers and RF power combiners. This is achieved through new blocks that perform more than one function, thus allowing for an integrated array that is much more compact and energy-prudent than its more traditional counterparts.

Systems, arrays, and architectures according to the present disclosure can be used at and implemented for various desired frequency bands and applications. In exemplary embodiments, such desired frequency bands and applications can be GHz bands including the 22-29 GHz and 77-78 GHz bands for automotive radar applications, 24 GHz and 59-64 GHz Industrial Scientific Medical (ISM) bands for wireless local area networks, and the 71-76 GHz, 81-86 GHz, and 92-95 GHz bands for point-to-point wireless communications. Embodiments of the present disclosure may also implement and/or utilized other desired frequencies. For example, narrow bands at or around 2.4 GHz and 5 GHz may also be implemented.

Further aspects of the present disclosure can provide ultra-wideband architectures and methods that utilize a first reference signal source that is coupled to a VPRO as well as a second reference signal source. The coupling or connection between the VPRO and the first reference source can be by a first phase locked loop and/or a filter such as a quadrature all-pass filter. The connection between the first reference source and the second reference source can be by a separate phase-locked loop, which can produce/provide a division factor for the connection.

BRIEF DESCRIPTION OF THE DRAWINGS

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIG. 13(a) depicts a circuit diagram of elements of a UWB VPRO while FIG. 13(b) depicts a circuit diagram of a related squarer circuit, in accordance with exemplary embodiments;

FIG. 16(a) depicts a circuit diagram of a power amplifier in accordance with present disclosure; FIG. 16(b) depicts a graph of measured small signal parameters for 0/180 paths for an embodiment of the present disclosure.

Figure 1A:
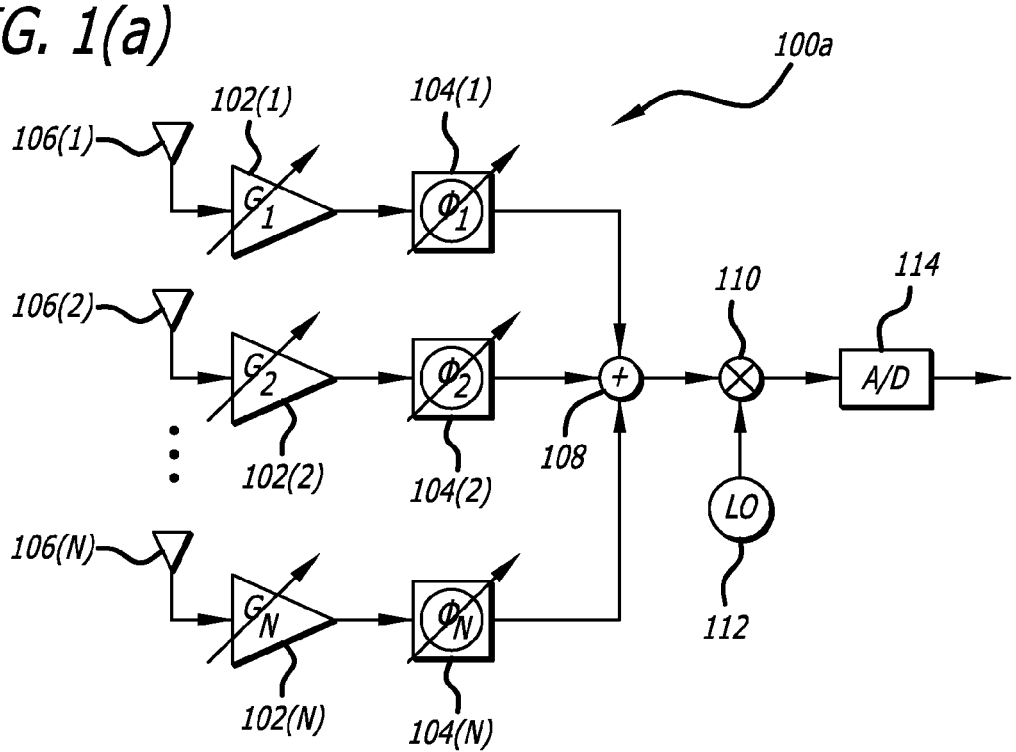
FIG. 1 includes FIGS. 1(a)-1(b), which depicts two conventional approaches 100a and 100b to phase shifting and power combining in the signal path for a phased array.
Figure 1B:
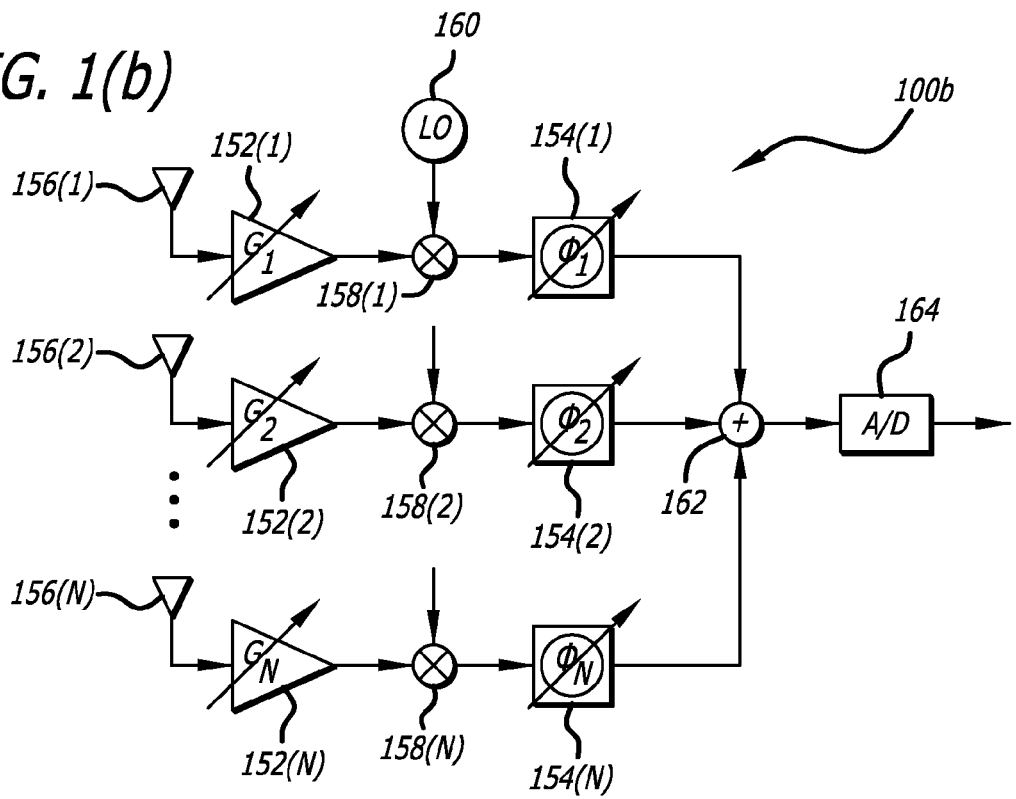
Figure 2A:
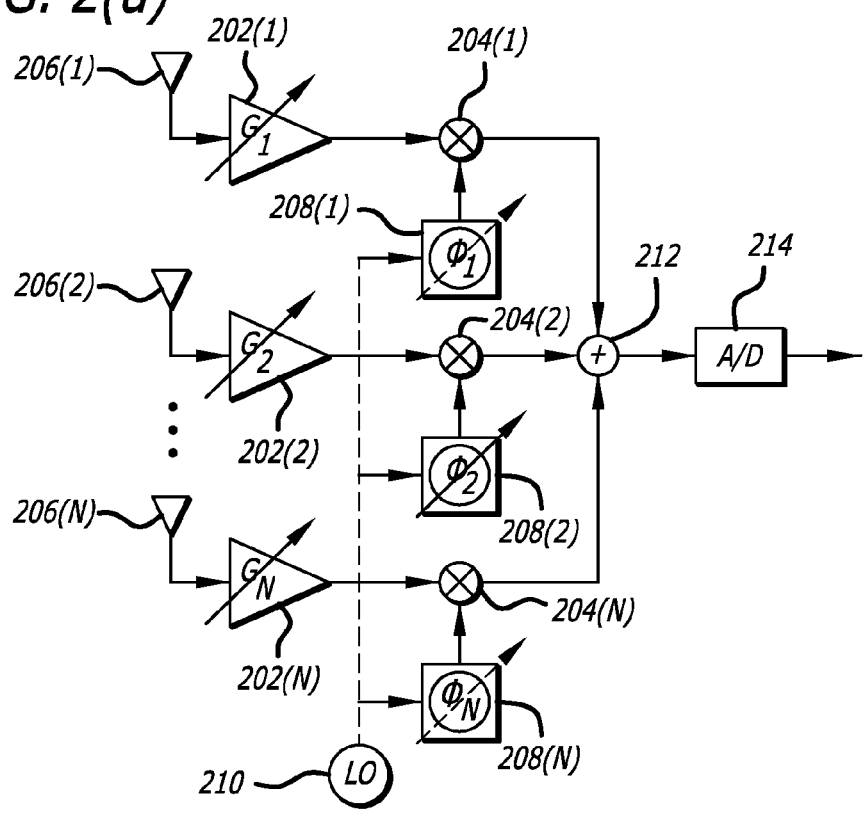
FIG. 2 includes FIGS. 2(a)-2(b), which depict two alternative conventional approaches 200a and 200b to phase shifting and power combining for a phased array.
Figure 2B:
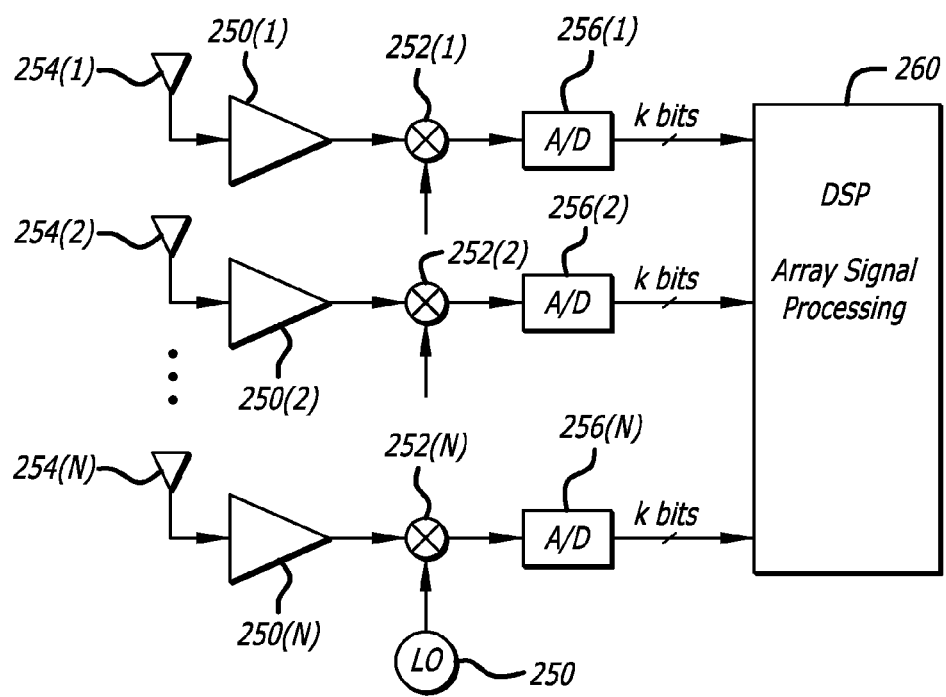

While certain embodiments are shown in the drawings, one skilled in the art will appreciate that the embodiments depicted in the drawings are illustrative and that variations of those shown, as well as other embodiments described herein, may be envisioned and practiced within the scope of the present disclosure.

Moreover, one skilled in the art will also appreciate that, while certain component values and/or ratings are shown in the drawings, other suitable parts/components with other suitable values and/or ratings may be used within the scope of the present disclosure.

DETAILED DESCRIPTION

Embodiments of the present disclosure are directed to variable-phase ring oscillator ("VPRO") arrays, architectures, and related methods that allow for a linear phase progression between adjacent elements in array by providing a symmetric ring configuration of tuned amplifiers and a single phase shifter. Such ring topologies can be coupled to a single phase locked loop ("PLL") that allows for direct modulation and demodulation of arbitrary waveforms without using RF up/down converting mixers. In addition, the PLL distributes the transmit waveforms to all antenna elements in the transmit mode and combines the received waveforms in the receive mode without any complicated power distribution network. Additional PLLs may be used for concurrent beam forming.

Exemplary embodiments of the present disclosure provide for a fundamentally different approach to beam-forming by integrating all the radiating elements (antennas) and electronics on a single substrate, e.g., in a single standard silicon wafer. The radiated electromagnetic (EM) field from the silicon wafer is controlled by having several micro-radiators integrated in a closely spaced mesh. These micro-radiators are controlled via integrated electronics that operate at radio frequencies (RF), microwave, and millimeter waves depending on the specific application. Generation of the desired RF beam and radiation can occur in one integrated architecture. The co-design of radiators, RF electronics, and the signal processing core all on the same silicon wafer results in substantial improvements in cost, size, and reliability. Accordingly, exemplary embodiments can be implemented on a single semiconductor (e.g., silicon) wafer and can be connected to source of energy (i.e., battery) that can form arbitrary desired beam(s) for imaging, communication, and/or radar. As such, it can be used as a compact personal radar, communication device, or sensing element in a collaborative sensory network.

To form arbitrary beam pattern(s), the EM field distribution on a wafer/substrate, e.g., a silicon wafer can be actively controlled. For such control, the amplitude and phase of the RF signal in each antenna site, e.g., μ-site, on the wafer/substrate, can be appropriately controlled according to techniques of the present disclosure. For, example, at the center of each antenna site, a μ-radiator can be located that can efficiently couple the generated EM wave in to air. Appropriate circuitry, e.g., as shown and described herein, may be coupled to the antenna site(s) to generate a modulated waveform in transmit mode and recover the information signal from the RF carrier in receive mode.

Embodiments of the present disclosure can provide for one or more of the following, alone or in any combination: (i) one-dimensional array architecture for single frequency beam-forming; (ii) two-dimensional architecture for single frequency beam-forming; (iii) concurrent multi-frequency beam-forming arrays; and (iv) RF, microwave, and millimeter wave circuit design and silicon integration. A standard low-cost silicon process technology can be used, which allows for the integration of high frequency analog front-end and digital signal processor (DSP) on the same substrate or package. Such architectures can reduce the size, cost, and power consumption compared to existing and brute force approaches, e.g., allowing techniques of the present disclosure to be used in wide deployment in mainstream cars and automotive application. Other advantages and benefits are also within the scope of the present disclosure.

Figure 3A:
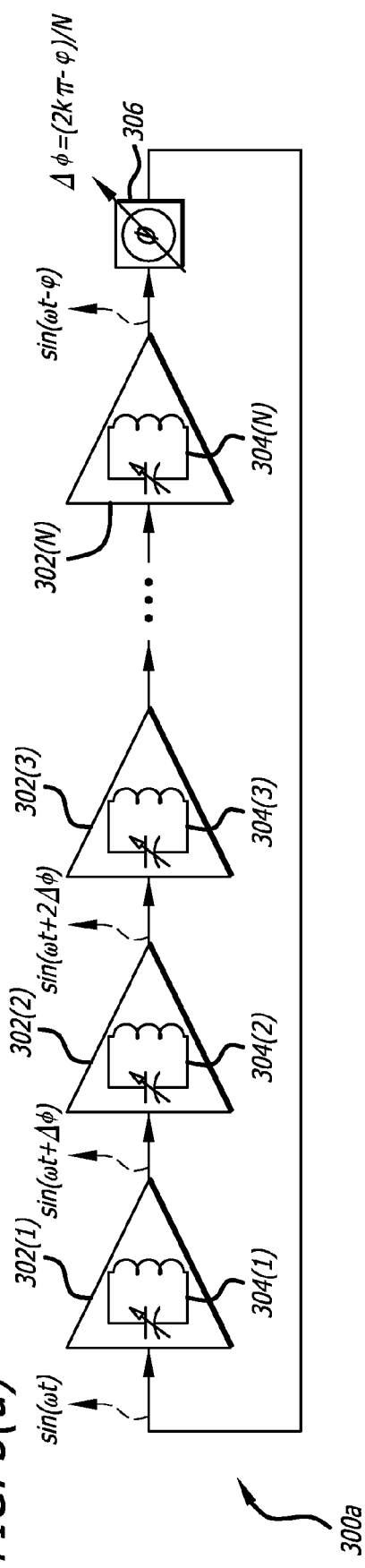
FIG. 3 includes FIGS. 3(a)-3(b), which depict alternative embodiments 300a-300b of a one-dimensional variable phase ring oscillator according to the present disclosure.
Figure 3B:
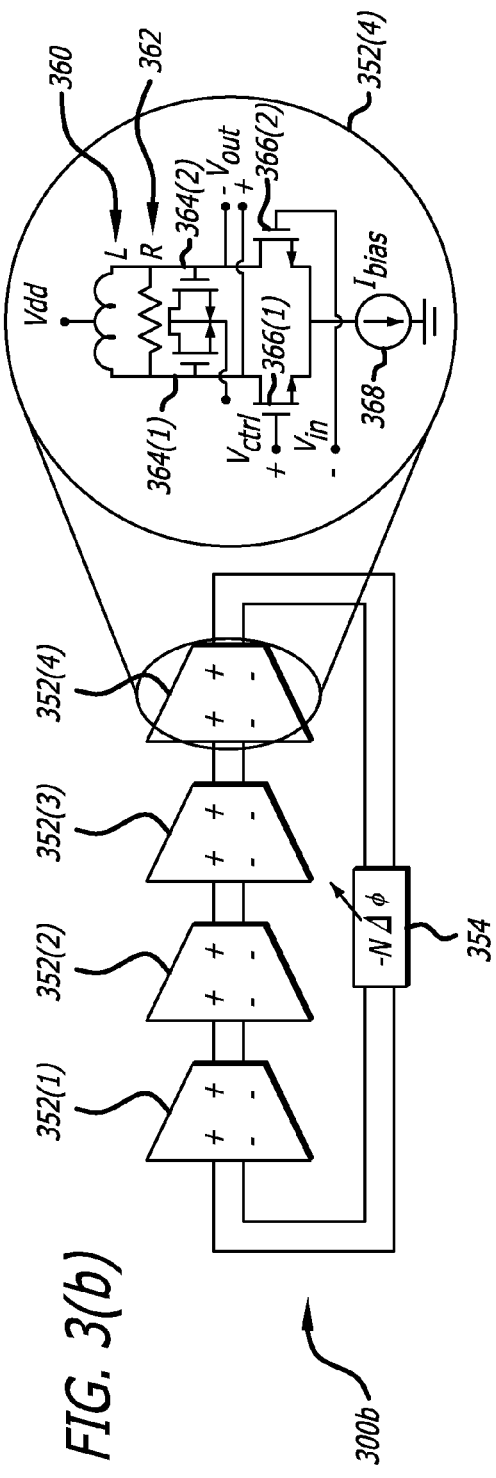

FIG. 3 includes FIGS. 3(a)-3(b), which depict alternative embodiments 300a-300b of a one-dimensional variable phase ring oscillator according to the present disclosure. FIG. 3(a) shows a one-dimensional variable phase ring oscillator architecture 300a suitable for single frequency beam-forming. The architecture 300a includes a ring configuration of identical second-order nonlinear elements, e.g., such as LC-tunable (or tuned) amplifiers 302(1)-302(N), and a delay structure, e.g., a narrowband phase shifter 306. The tuned amplified can include an inductor and variable capacitor (or varactor) in a tank circuit, e.g., 304(1)-304(N), as shown.

The architecture 300a shown in FIG. 3(a) is capable of generating a sinusoidal waveform if the loop gain is larger than one. In this case, the output voltage of all tunable amplifiers 302(1)-302(N) is a sinusoid at the same frequency. The phase shift between adjacent node voltages is equal to a value that satisfies the phase boundary condition around the loop. Therefore, a linear phase progression, $\Delta\Phi$, between adjacent elements 302(1)-302(N) is realized and it can be continuously varied via a single phase shifter based on the following expression:

$$\Delta\phi = \frac{2k\pi - \varphi}{N} \quad (1)$$

where φ is the phase shift provided by phase shifter, N is the number of elements in the ring configuration, and k is any arbitrary integer. For instance, in the absence of phase shifter, one steady-state solution is where all nodes produce sinusoidal oscillations with the same phase as symmetry dictates. As the phase shift between adjacent elements (input and output of tunable amplifiers) varies the oscillation frequency changes as well. This can be understood by noticing the phase transfer function of a second-order resonator as shown in FIG. 3(a). There are many phase shifts, and hence many oscillation frequencies, that satisfy expression (1) depending on the value of k. The present inventors have showed that all these modes are stable. As further shown and described herein, one method to fix or control this frequency by using a phase-locked loop (PLL).

With continued reference to FIG. 3(a), ring configuration of 300a can produce the linear phase progression of RF signal necessary for linear phased arrays (i.e., each node is driving an antenna element). To control the phase and amplitude of RF signal in an arbitrary way in order to set any desired EM field distribution on the silicon wafer, a tunable resonant load is used, as shown 304(1)-304(N). As the resonant frequency and hence the input-output phase and magnitude transfer function of the tuned amplifiers is a function of its capacitor value, for such tuning, an integrated variable capacitor or varactor can be used. In addition, the amplitude of signal at each node can also be set individually by applying appropriate bias to each amplifier. According, desired arbitrary signal phase and magnitude can be provided at each node by applying appropriate control voltages to the varactors load of each tuned amplifier as long as the loop boundary conditions are satisfied.

FIG. 3(b) shows another embodiment or configuration of a one-dimensional variable phase ring oscillator architecture 300b suitable for single frequency beam-forming. The architecture 300b includes a ring configuration of identical second-order nonlinear elements, e.g., such as amplifier differential pairs 352(1)-352(N), and a delay structure, e.g., a phase shifter 354.

With continued reference to FIG. 3(b), one configuration of a suitable amplifier differential pair 352(4) is shown enlarged. For such, inductor 360, resistor 362, coupled transistors 364(1)-364(2), 366(1)-366(2), and bias current source 368 are shown.

In beam-forming applications, the frequency of operation and beam form/angle should be controlled independently. In order to form a different beam, the phase shift and amplitude of each radiator is varied, however, that should not come at the expense of shifts in frequency. In order to fix the operating frequency in the architectures according to the present disclosure, a ring confirmation can be coupled to a PLL as shown in FIG. 4.

Figure 4A:
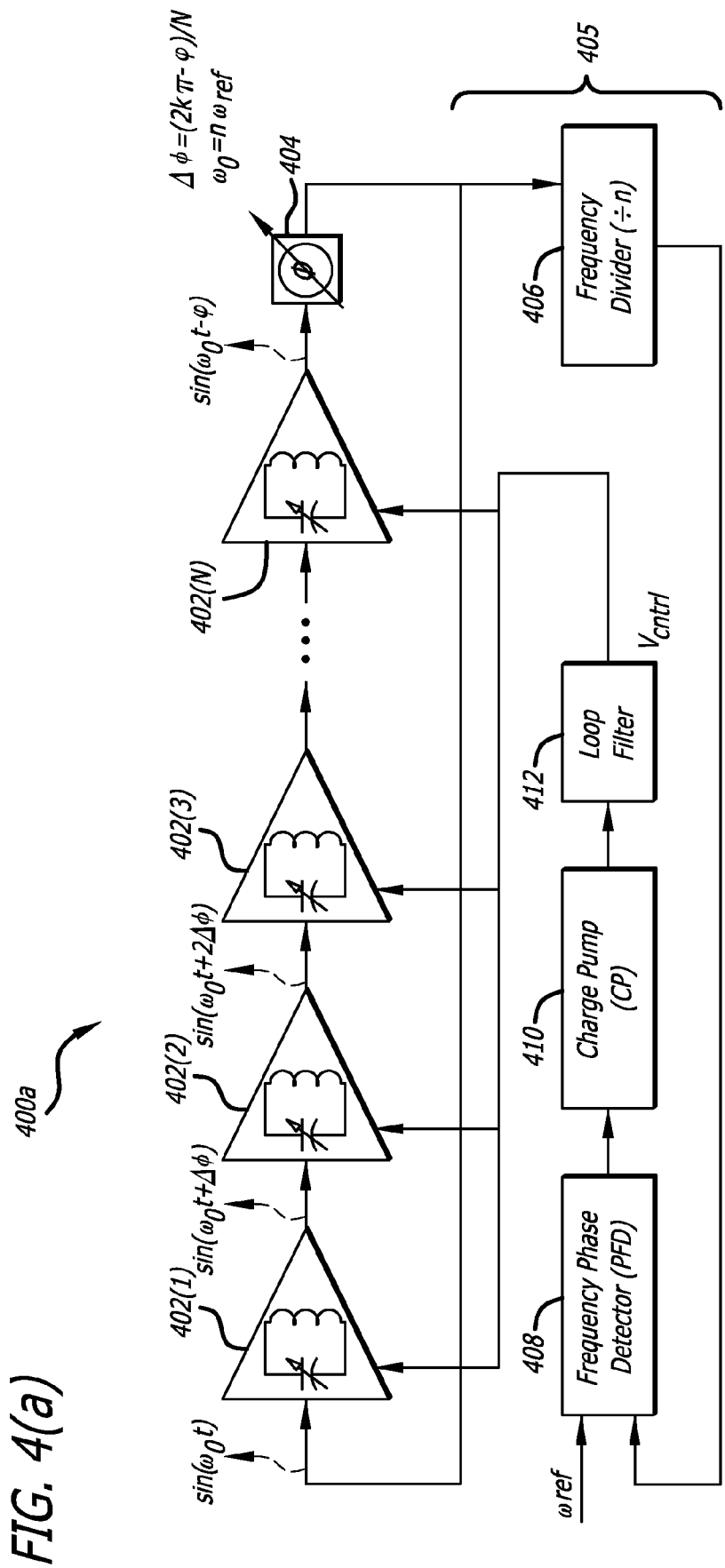
FIG. 4 includes FIGS. 4(a)-4(d), which depict a one-dimensional variable phase ring oscillator coupled to a phase-locked loop according to an embodiment, as well as the magnitude and phase of second-order transfer functions associated with a representative tuned oscillator.

FIG. 4 includes FIGS. 4(a)-4(d), which depict a one-dimensional variable phase ring oscillator architecture 400a according to an embodiment, as well as the magnitude and phase of second-order transfer functions associated with a representative tuned oscillator. In FIG. 4(a), architecture 400a includes a series of tuned amplifiers 402(1)-402(N) in a ring with phase shifter 404 that is coupled to a phase-locked loop (PLL) 405. PLL 405 includes frequency divider 406 connected to frequency phase detector (PFD) 408 connected to charge pump (CP) 410 in turn connected to loop filter 412. Control voltage ($V_{cntrl}$) is supplied from the PLL 405 to the tuned amplifiers 402(1)-402(N), as shown. In FIG. 4(a), two feedback loops work in conjunction: the phase loop sets the necessary phase shift between adjacent elements in the ring configuration while the frequency loop forces the oscillation frequency to be equal to that of a reference.

The PLL shown also has two other important functions: it can serve to modulate arbitrary transmit waveforms and distribute them to all elements without any complicated power distribution network or modulating mixers that are common in traditional schemes; the PLL cab also demodulate arbitrary received waveforms and combine them without using down converters, RF or LO signal distribution networks, or power combiners as will be explained supra.

Figure 4B:
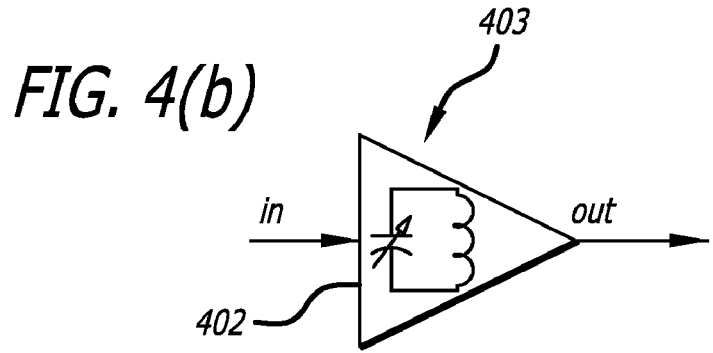
Figure 4C:
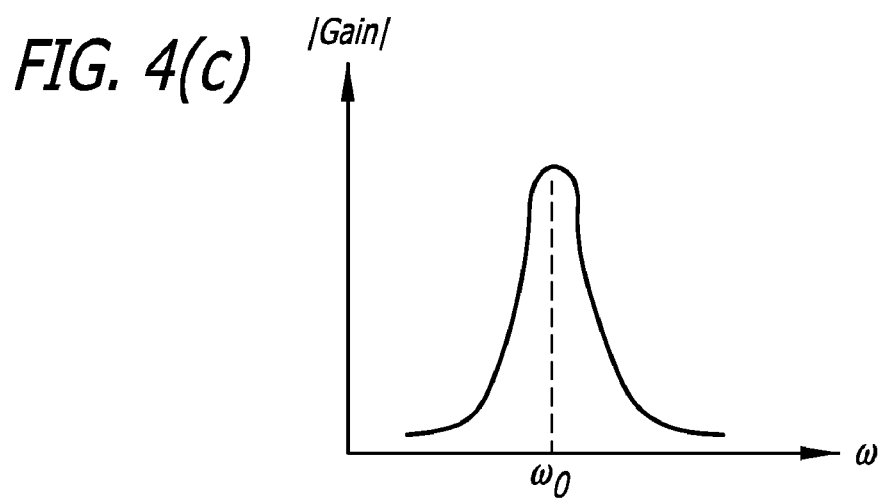
Figure 4D:
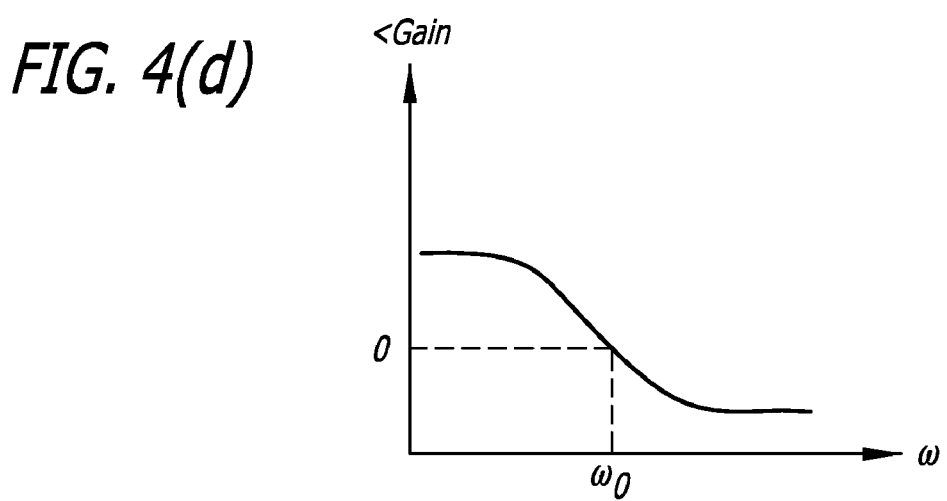
Figure 5:
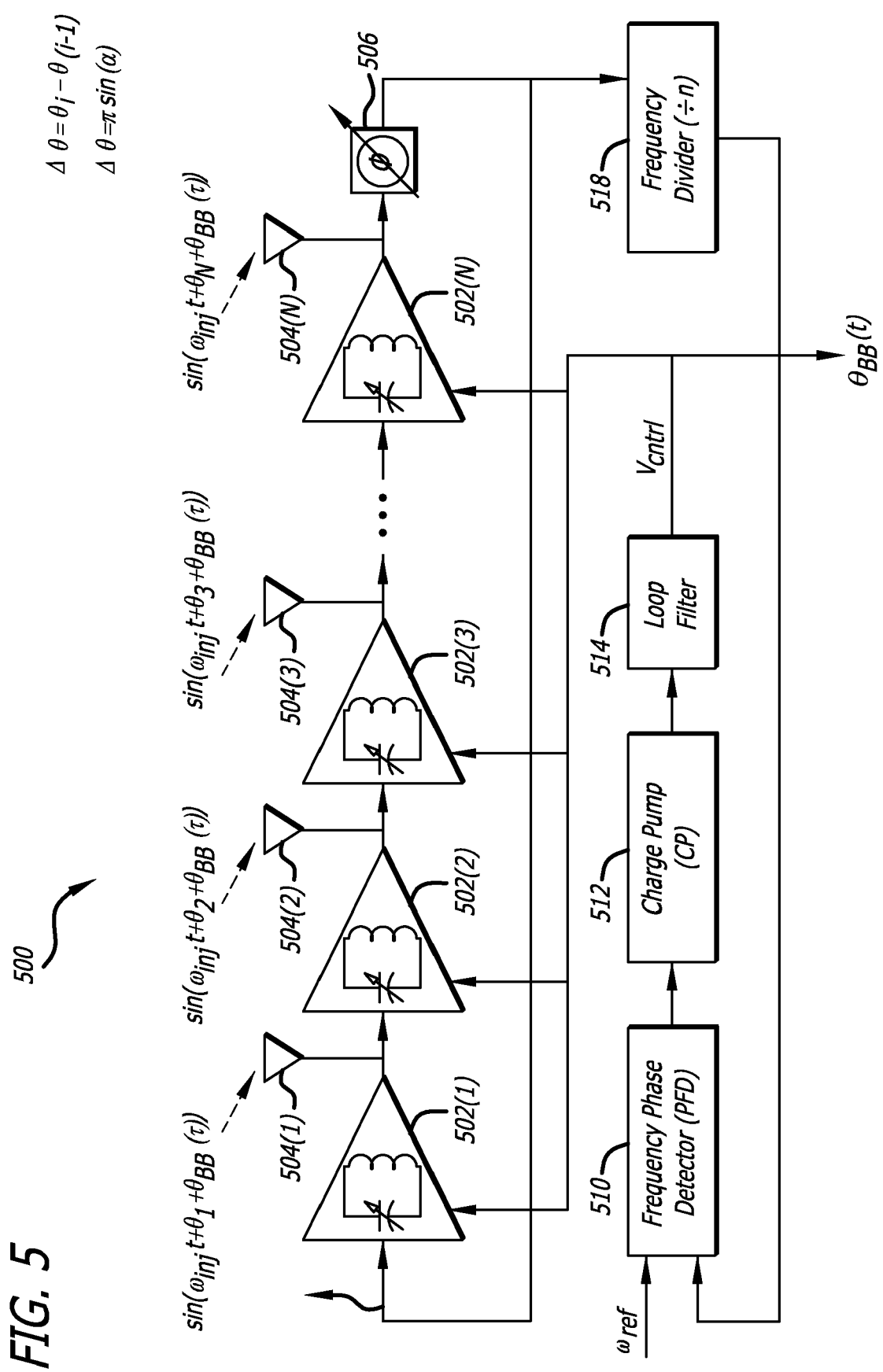
FIG. 5 depicts an embodiment of a variable-phase ring oscillator coupled to antennas in a one-dimensional array operating in receive mode.

FIG. 4(b) depicts the representative tunable oscillator 402 as utilized for FIG. 4(a). FIG. 4(c)-4(d) depict the magnitude and phase of second-order transfer functions, respectively, associated with the representative tunable 402 oscillator of FIG. 4(b);

FIG. 5 depicts an embodiment of a variable-phase ring oscillator coupled to antennas in a one-dimensional array 500 operating in receive mode.; The architecture shown in FIG. 5 is similar to the ring architecture 400a with PLL 405 combination that was described for FIG. 4(a), with the addition that each node of the ring is connected to an antenna (e.g., μ-radiator) 504(1)-504(N). Phase shifter 506, ids shown connected to a PLL including frequency divider 518 connected to frequency phase detector (PFD) 510 connected to charge pump (CP) 512 in turn connected to loop filter 514. Control voltage ($V_{cntrl}$) is supplied from the PLL to the tuned amplifiers 502(1)-502(N), as shown.

With continued reference to FIG. 5, in operation of the array 500, the information signal at baseband is added to the varactors control voltage inside the PLL. In the absence of this signal, the control voltage value will settle to a constant value set by PLL in order to force the frequency of the ring structure equal to a multiple of reference frequency, $\omega_{ref}$. Each antenna will then radiate a different phase of the same frequency. The relative phase of the signal at each node depends on the value of variable phase shifter, number of tuned amplifiers, and the value of their variable resonant frequency. In transmit mode, a baseband signal can be explicitly added (not shown) to the control voltage node, which allows the PLL to force the frequency of ring structure to vary correspondingly.

In other words, at steady state the ring structure generates a modulated waveform around center frequency $\omega_{ref}$. The phase of radiated signal from each node at the RF frequency for the modulated waveform is still dictated by the ring structure. The control voltage that is applied to each element and the amplifier bias current can be varied independently in order to achieve arbitrary phase and amplitude at each node. This is useful to control the levels of sidelobes, location of nulls, number of main beams, and their beam widths at a single carrier frequency. Direct modulation of PLL eliminates RF up-converters, RF power splitters, and LO distribution networks that are necessary in conventional schemes.

With continued reference to FIG. 5, topology or architecture 500 can also demodulate the incident wave without adding extra components, as indicated. First, the ring architecture of interest can be considered without the PLL when exposed to a plane wave at $\omega_{inc}$ incident from an angle. Depending on the closeness of injected frequency to ring's natural frequency, the strength of incidence wave, and incidence angle two scenarios can happen. The first case is where the natural oscillation frequency of the ring changes and locks to $\omega_{inc}$.

Locking range, $\Delta\omega_{lock}$, the difference between ring's natural frequency and incidence frequency where locking happens, can be calculated to be $$\Delta\omega_{lock} \frac{\omega_0 \varepsilon (1 + \tan^2(\Delta\phi))^{\sin\left(\frac{N(\Delta\theta - \Delta\phi)}{2}\right)}}{2Q + \tan(\Delta\phi) N_{\sin}\left(\frac{\Delta\theta - \Delta\phi}{2}\right)} \quad (2)$$

where Q is the quality factor of each resonator, $\omega_o$ is the ring operating frequency, $\varepsilon$ is the relative strength of incident wave compared to the natural signal at each node of the ring, and $\alpha$ is the incidence angle. Expression (2) shows that $\Delta\omega_{lock}$ contains the beam steering information (array factor) as a function of incidence angle. Phase distribution across the ring under locked condition derives from $$\tan^{-1}\left(Q\left(1 - \frac{\omega^2}{\omega_c^2}\right)\right) = \frac{2k\pi + \Delta\phi}{N} \quad (3)$$

where k is any arbitrary integer. Depending on the value of k there are various regions where locking can happen. In each region, the locking range is a function of incidence wave angle as predicted by (2). If the incidence frequency, $\omega_{inc}$, is outside the locking range, the ring frequency gets pulled towards $\omega_{inc}$ and side tones appear around the main frequency.

With continued reference to FIG. 5, in the presence of PLL, the control voltage, $V_{cntrl}$, that adjusts the center frequency of each resonator is given by $$V_{cinrl} = \frac{\Delta\omega_{lock}}{K_{vca}} \sin(\Delta\omega_{inc} t + \theta_{BB}(t)) \quad (4)$$

where $K_{vco}$, often referred to as VCO gain, measures the sensitivity of ring frequency to the changes in the control voltage and $\Delta\omega_{inc}$ is the instantaneous difference between the frequency of incident wave and oscillators' natural frequency. In conclusion, the amplitude of $V_{cntrl}$ has the beam steering information (incidence angle, peaks, nulls) while the frequency of $V_{cntrl}$ contains the down-converted baseband information, $\theta_{BB}(t)$. It is important to note that the combination of the proposed ring array architecture and the PLL derives the beam steering information and modulated signal without using any power splitters, any RF mixers, and N phase shifters.

Embodiments of the present disclosure provide the ability to arbitrarily form the EM beam(s) using large number of closely spaced radiating elements on a silicon wafer. As noted previously, one of the major limitations of conventional schemes such as the coupled oscillator array is their unacceptable sensitivity to mismatches in the array. Embodiments of the present disclosure are more robust and are resistant to such mismatches, e.g., by an order of magnitude compared to the coupled oscillator array. As an example, the error in the beam pointing angle in exemplary embodiments according to the present disclosure, $\theta_{error}$, can be represented by $$\theta_{error} = \frac{2Q}{n\pi \cos\theta_0 (1 + \tan\Delta\phi)} \sum_{i=1}^{n}\left(1 - \frac{6(i-1)(n-i+1)}{n^2 - 1}\right)\left(\frac{\Delta\omega_i}{\omega_0}\right) \quad (5)$$

where $\theta_o$ is the beam pointing angle with no mismatches, $\omega_o$ is the nominal resonance frequency of elements with no mismatches, and $\Delta\omega_i$ is the frequency deviation of each resonator from the nominal value due to component mismatches. The beam pointing accuracy improves with number of array elements, N, and the beam pointing angle, $\theta_o$.

Figure 6:
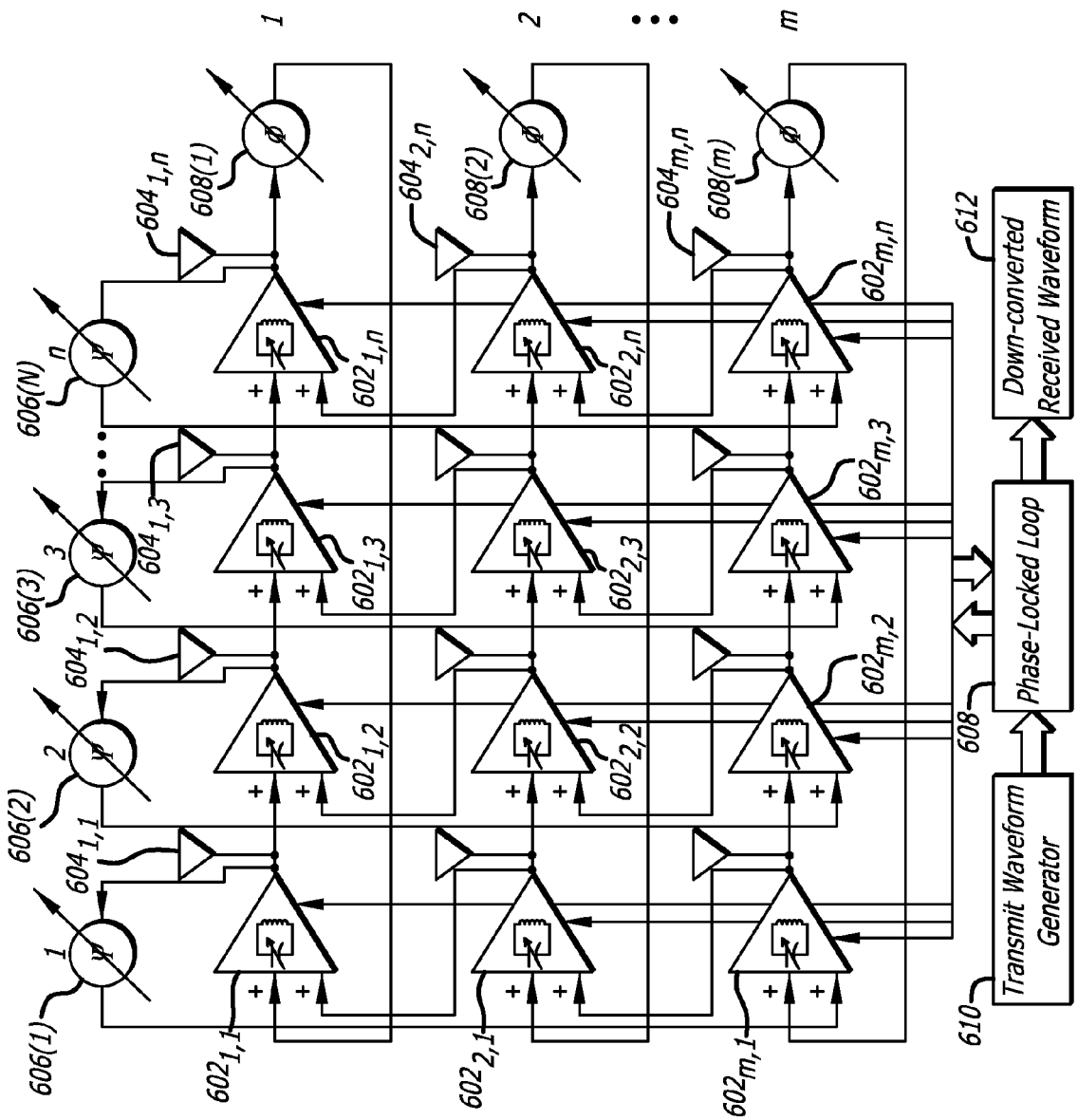
FIG. 6 depicts an embodiment of a two-dimensional m×n array architecture.

One-dimensional beam-former architecture can be easily extended to two-dimensional (2D) arrays. FIG. 6 depicts an embodiment of a two-dimensional m×n array architecture 600 of antenna (e.g., 604$_{1,1}$, etc.). Phase shifter for each dimension of the array are shown, 606(1)-606(N) and 608(1)-608(M). Transmit waveform generator 610 is shown connected to PLL 608 which is connected to the array and is configured to produce down-converted received wave form 612.

In a 2D architecture, such as shown in FIG. 6, each tuned block amplifies the summation of signals from its adjacent row and column as shown in FIG. 6. By using such a scheme, electromagnetic beam(s) can be pointed to arbitrary elevation and azimuth. In conventional 2D N×N (or N×M) array architectures, a separate phase shifter per antenna element is required. In exemplary embodiments, as shown, only one shifter per row and per column of the array is required and hence the total number of phase shifters is reduced from $N^2$ to 2N (or N×M to N+M).

Figure 7:
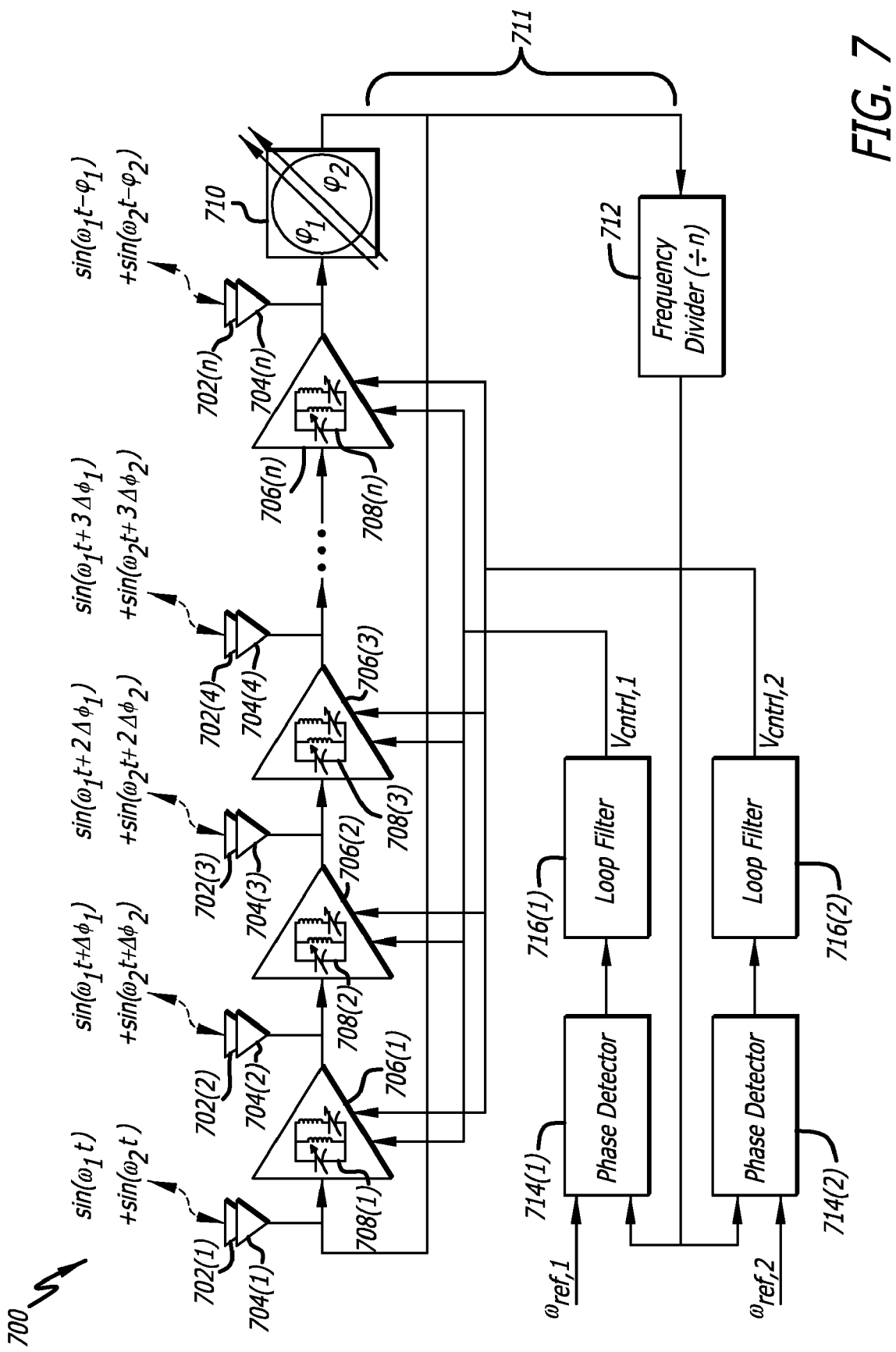
FIG. 7 depicts an embodiment of a multi-frequency beam forming array according to the present disclosure, with one-dimension shown for simplicity.

One of the features provided by the present disclosure is a fully integrated architecture where multiple independent beams at different frequencies can be formed and electronically scanned towards independent targets, simultaneously. Each of these independent beams can be used for communication, sensing, imaging, or other purposes, e.g., radar applications. FIG. 7 depicts one such embodiment of a multi-frequency beam forming array 700 according to the present disclosure, with one-dimension shown for simplicity.

In FIG. 7, the multi-frequency beam forming array 700 includes antennas 702(1)-702(N) configured for a first frequency $\omega 1$ and antennas 704(1)-704(N) configured for a second frequency $\omega 2$. Tuned amplifiers 706(1)-706(N) include doubly resonant (fourth-order) circuits 708(1)-708(N). Array 710 is depicted by a concurrent dual-frequency ring structure with a fourth-order PLL 711. A single phase shifter 710 with two degrees of freedom modifies the phase of its input signal at each frequency by an independent amount. PLL include frequency divider 712 coupled to phase detectors 714(1)-714(2) and loop filters 716(1)-716(2) for producing control voltages Vcntrl,1, Vcntrl,2 based on the references shown.

In steady-state, each node of the ring of 700 generates two frequencies, while a single phase shifter adjusts the phase progression between adjacent elements at both frequencies, independent of each other. Therefore, arbitrary and independent beams can be formed at two frequencies, concurrently. Modulation and demodulation can be done inside the fourth-order PLL similar to the single frequency case, e.g., described for FIG. 3.

Accordingly, embodiments similar to that of FIG. 7 offer advantages over the prior art as using conventional approaches discussed previously, a large number of independent RF transceivers, phase-shifters, power combiners, and ADCs are required to achieve concurrent multi-frequency beam-forming. Specifically, if concurrent operation at m frequency bands is desired, and the number of antenna elements in a one-dimensional array is N, a total of m×n RF transceivers are required in conventional approaches.

It should be understood that although the schematic is shown in FIG. 7 for the case of one-dimensional concurrent dual-frequency beam-former, the idea can be extended to support more concurrent frequencies (by using higher order resonators for each amplifier), and to two-dimensional arrays; the nonlinear analysis of sixth- and higher-order systems is more involved.

The beam-forming ring architecture of FIG. 7 includes higher order multi-resonant systems 706 (1)-706(N)—replacing the second-order systems shown in FIG. 3. Such a system has multiple stable modes of operation in steady-state, specifically, it can generate stable oscillations at any of resonant frequencies and more interestingly it can generate stable oscillations at all resonant frequencies, simultaneously. It should be emphasized that in general the resonant frequencies are completely independent of each other and therefore the output, which is a sum of independent sinusoids, does not have to be a periodic function (asynchronous oscillations). The multi-resonant ring is a special case of multi-mode oscillators.

Using nonlinear analysis in the case of a fourth-order system (dual-frequency oscillator), we were able to find and implement methods that control the steady-state stable mode: oscillations at $\omega_1$, oscillations at $\omega_2$, or simultaneous oscillations at $\omega_1$, and $\omega_2$. Moreover, we have recently showed that a not only a single oscillator can generate simultaneous frequencies, by also can vary each frequency independently using a single high-order phase-locked loop.

Figure 8:
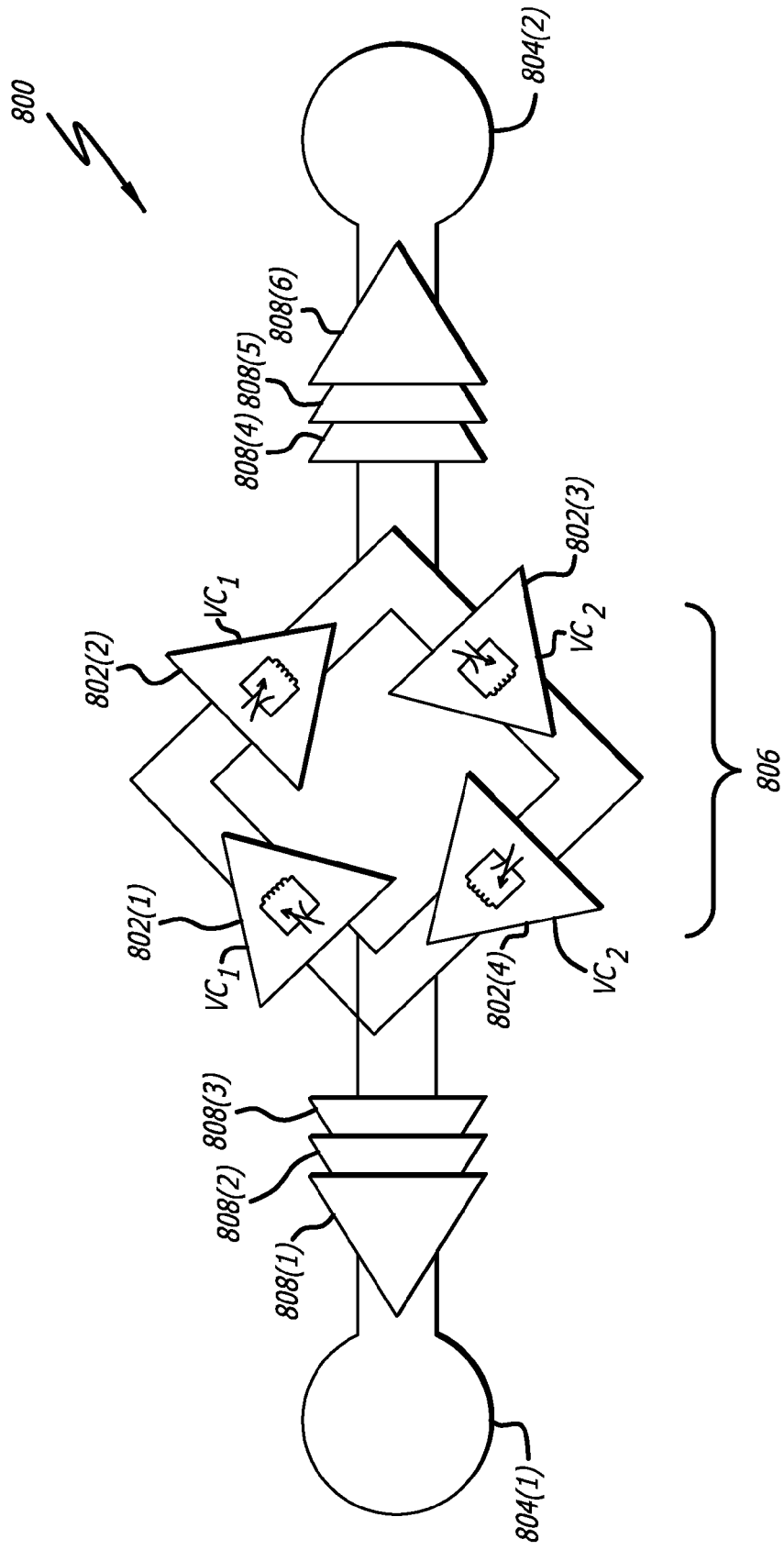
FIG. 8 depicts a two-element embodiment as constructed on a die with 0.13 micron CMOS technology and implementation at 70 GHz.

FIG. 8 depicts a two-element embodiment 800 as constructed on a die with 0.13 micron CMOS technology and implementation at 70 GHz. As shown, four tuned amplifiers 802(1)-802(4) were constructed in a ring topology, connecting two ring antenna 804(1)-804(2) by way of LNA/PA 808(1)-808(6). For the embodiment shown, the PA output power was 11 dBm, antenna efficiency was 11%, and the die area was 3.2 mm×1.3 mm.

Figure 9:
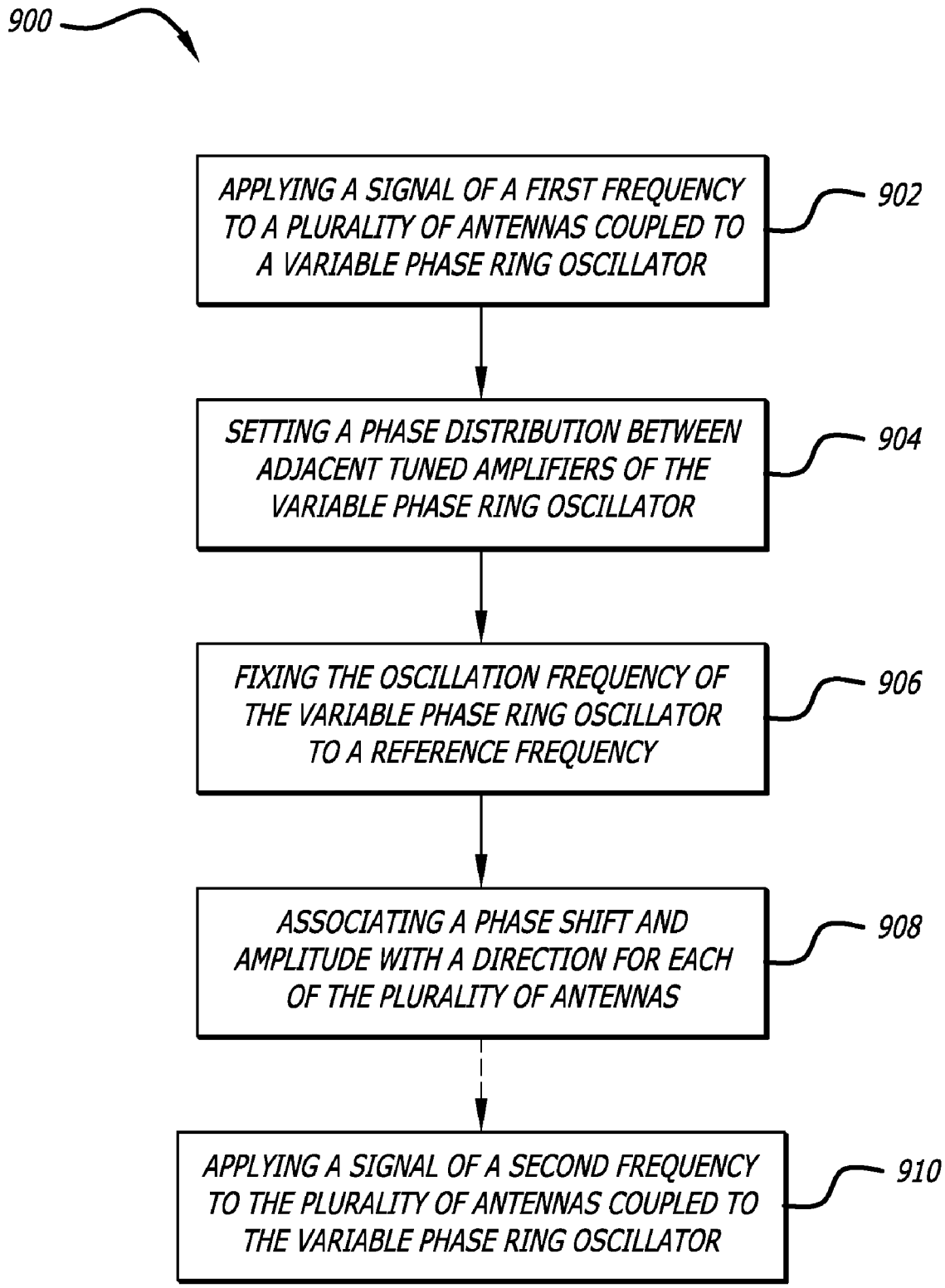
FIG. 9 depicts a method of applying a signal to a variable-phase ring oscillator architecture, in accordance with exemplary embodiments of the present disclosure.

FIG. 9 depicts a method of 900 applying a signal to a variable-phase ring oscillator architecture, in accordance with exemplary embodiments of the present disclosure. A signal can be applied to a variable phase ring oscillator coupled to a plurality of antennas, as described at 902. An integer number of successive phase delays can be provided to the signal with the ring oscillator, as described at 904. The frequency of the ring oscillator can be locked with a phase delay structure, as described at 906. A phase shift and amplitude of a signal can be associated with a direction for each of the plurality of antennas, as described at 908.

Exemplary embodiments directed to concurrent beam-forming can include application of a signal of a second (or additional) frequency(cies) to the plurality of antennas coupled to the variable phase ring oscillator, as described at 910.

With continued reference to FIG. 9, the method cab include applying a signal to a variable phase ring oscillator that include transmitting a signal from variable phase ring oscillator coupled to the plurality of antennas. Applying a signal to a variable phase ring oscillator can include receiving a signal from variable phase ring oscillator coupled to the plurality of antennas. The method 900 for transmitting applications can include modulating a carrier signal, which can include modulating a carrier signal comprises a phase modulation scheme. The modulation scheme comprises BPSK modulation.

Receiving according to method 900 can include demodulating a carrier signal. Demodulating a carrier signal can include a phase demodulation scheme, which can in certain embodiments be selected from the group consisting of QAM, OFDM, BPSK, AM, FM, PM, QPSK.

Embodiments of method 900 can include determining a distance to a target object using the signal applied to the variable phase ring oscillator coupled to a plurality of antennas. Method 900 can include application of a GHz signal. In exemplary embodiments, such can be a 22-29 GHz, 59-64 GHz, 71-76 GHz, 77-78 GHz, 81-86 GHz, or 92-95 GHz band.

Further embodiments according to FIG. 9, can include that determining a distance comprises determining a distance from an object to an automobile connected to the variable phase ring oscillator coupled to the plurality of antennas.

Exemplary Embodiments

RF, Microwave, and Millimeter Wave Circuit Design and Silicon Integration

Design and implementation of RF, microwave, and millimeter wave circuits using a silicon technology (CMOS and SiGe) is one of the key enablers/factors in the realization of embodiments of the present disclosure. The present inventors have already demonstrated numerous high performance circuits and beam-formers at 2 GHz, 5 GHz, 15 GHz, 24 GHz, and 26 GHz using 0.18 μm CMOS (TSMC) and SiGe BiCMOS (IBM7HP) processes. The new generation of SiGe HBT technology (IBM8HP) offered by the IBM foundry have $f_{max}$=285 GHz, and is capable of generating more than 10 dB power gain per transistor at the potential imaging frequency of 94 GHz. Based on measurements at 60 and 77 GHz, these devices are expected to achieve a noise figure (NF) of less than 6 dB at 94 GHz. In addition, this process includes 0.13 μm CMOS transistors, which allows the direct integration of imaging sensor's high speed digital signal processing (DSP) on the same wafer. Accordingly, in exemplary embodiments of ring architectures, each amplifier can be a low-noise power amplifier (LNNPA) to facilitate both transmit and receive cases without any switches as described before.

Figure 10:
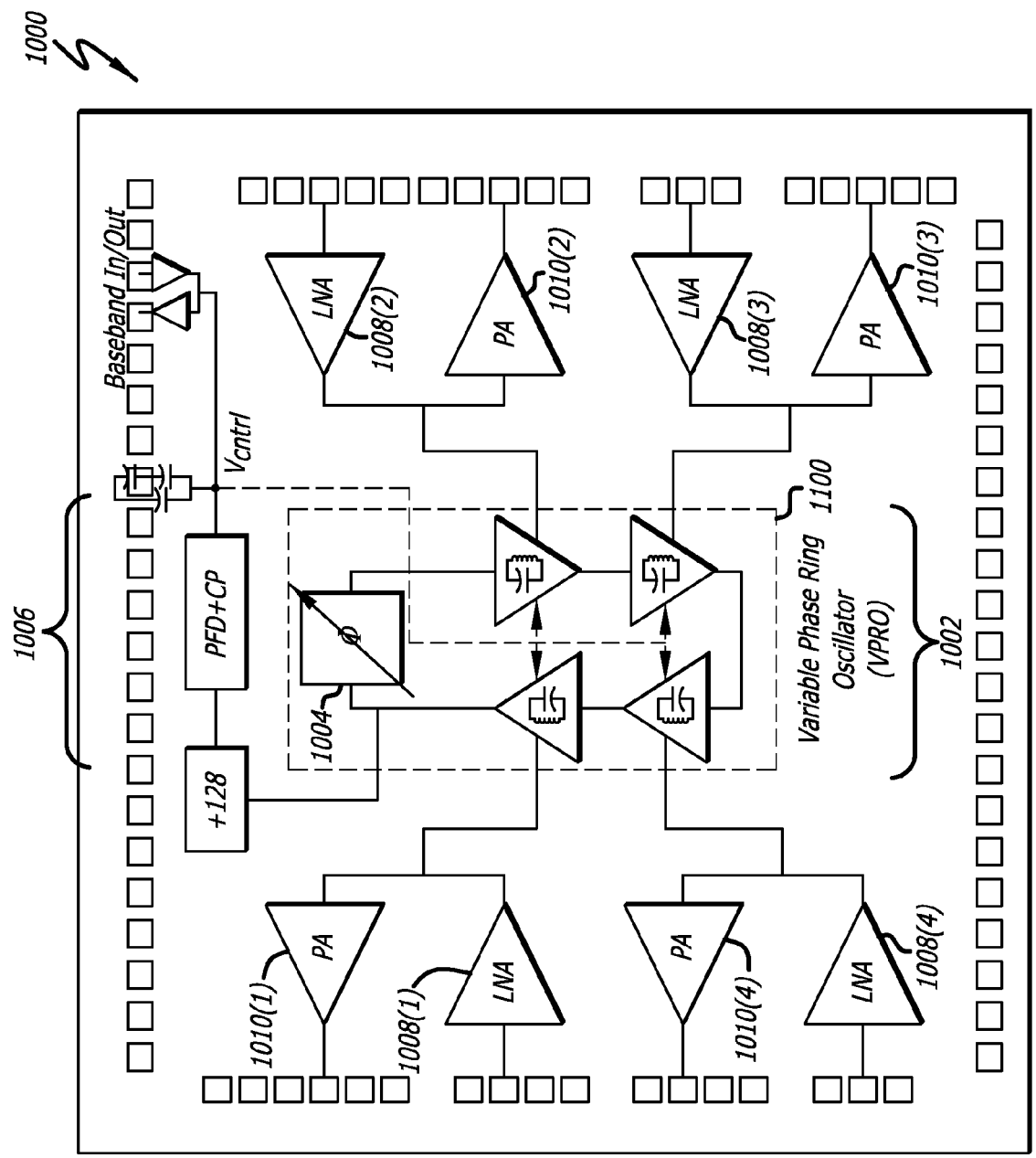
FIG. 10 is a photograph with circuit overlay of a 24 GHz 0.13 micron CMOS variable phase ring oscillator transmitter and receiver architecture according to an exemplary embodiment of the present disclosure.

FIG. 10 is a photograph with circuit overlay of a 24 GHz 0.13 micron CMOS variable phase ring oscillator transmitter and receiver architecture 1000 according to an exemplary embodiment of the present disclosure. The architecture shown was constructed as a four-channel 24 GHz CMOS phased array transceiver on a die approximately 2.15 mm by 2.35 mm in size. A ring of tuned amplifiers 1002 is shown coupled to a phase shifter 1004 and PLL 1006. Low noise amplifiers (LNA) 1008(1)-1008(4) are shown with power amplifiers 1010(1)-1010(4) as configured for coupling to antenna (not shown).

Figure 11:
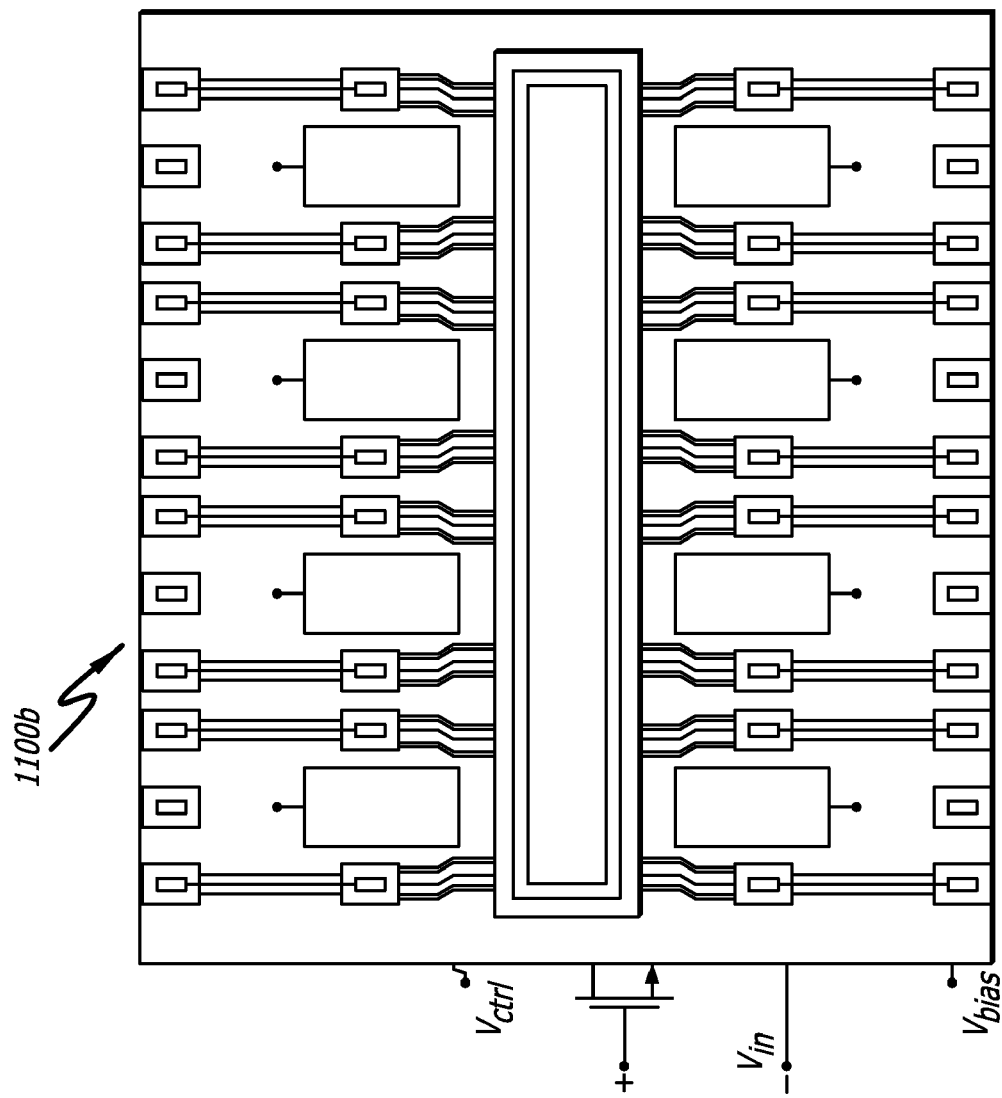
FIG. 11 is an enlargement of a portion of FIG. 10 along with a corresponding circuit diagram.
Figure 11:
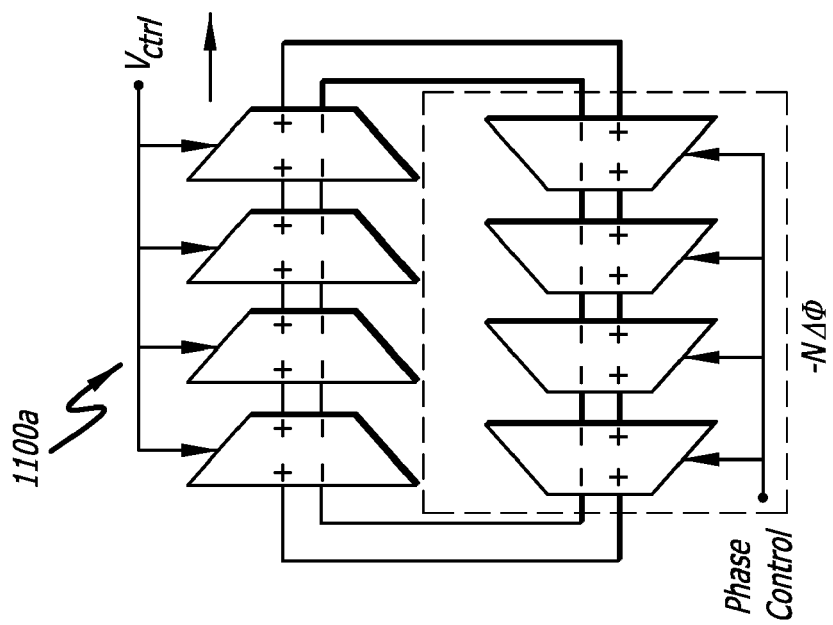

FIG. 11 is an enlargement of a portion 1100 of FIG. 10 along with a corresponding circuit diagram. Diagram 1100a shows a circuit diagram of the ring of FIG. 10 with phase control. Picture 1100b shows the enlargement of area 1100 of FIG. 10.

Exemplary Embodiments

Micro Radiators

Micro radiators useful as antenna according to the present disclosure can be configured as on-chip differential radiating elements that act as the resonant load of tuned amplifiers at each node of the proposed ring architecture. Formation and radiation of phased array pattern can be accomplished in one step. From this point of view, the overall system efficiency can be defined as the ratio of radiated electromagnetic energy in the desired direction to the energy drawn from the power source. In order to maximize the system efficiency, each nonlinear block of the ring configuration should convert most of the DC power to a stored power in standing wave EM fields that are radiated. The small (sub wavelength) spacing between these radiators removes the unwanted grating lobes out of the visible space for wide beam scanning. Unlike traditional implementations of phased arrays, the coupling between antenna elements is not a concern. The reason is that desired beam patterns are formed by setting EM boundary condition (amplitude and phase) on a silicon wafer via a closely spaced mesh of micro-radiators. Micro-radiators work collectively to set a boundary condition corresponding to a desired beam pattern.

Proper lengths of microstrips form a standing wave at the desired frequency that potentially couples to air for radiation. In a standard silicon process, the proximity of the ground plane to the conductor (typical space between the topmost and bottommost metal layers is less than 15 μm) causes the image current to cancel the radiation of the signal current. The extent of radiation is therefore proportional to the signal-ground separation, limiting the radiation efficiency to less than 1-2%. Radiation efficiency can be increased by placing the ground plane at the back side of silicon chip. Unfortunately, the electromagnetic fields in this case penetrate the lossy silicon substrate where a significant portion of energy is dissipated. In exemplary embodiments, the ratio efficiency of on-chip ring antennas may be maximize or optimized by tapering techniques and also by using floating metal shields under the antenna. These floating metals reduce electrical length of the antenna (slow wave structure) and reduce the loss.

Exemplary embodiments of these radiators can be realized on the top metal layer of a standard silicon process that is 15 μm above the 10Ω—cm substrate with a thickness of 250 μm. The radiation efficiency of these antennas are 10%, and 15% at 90 GHz, respectively, which is significantly higher compared to previously reported on-chip antennas. We anticipate increasing the antenna efficiency to around 30% with our proposed tapering scheme and slow wave structure.

Exemplary Applications

Exemplary embodiments of the present disclosure can be used in two different configurations: either as a standalone handheld device, or as a unit cell in a collaborative network of similar devices that are randomly placed or tiled in the desired environment under control. embodiments of the present disclosure can serve under various scenarios for wireless communication and imaging including the following:

Solider and Personnel Safety

Embodiments of the present disclosure can be placed as embedded sensors in clothing and can be networked with all other personnel and vehicles. It can be configured as handheld device (personnel low-range RADAR) for the detection of enemy, improvised explosive devices (IED), and injured soldiers in search and rescue missions.

Cooperative Autonomous Agents

Embodiments of the present disclosure can be used as both an imaging system and a communication device in a network of cooperative autonomous agents in the battlefield such as unmanned tanks and unmanned aerial vehicles (UAV).

Multi-Function Wireless Communication

Each embodiments of the present disclosure silicon wafer can be used for multi-function wireless communication and imaging device where multiple electromagnetic beams at different frequencies can be formed concurrently, each beam for a particular application (e.g., independent beams for voice, data, global positioning system, RADAR).

Exemplary embodiments may provide radar for automobile applications, e.g., collision avoidance/mitigation. It is expected that in the near future all cars will be equipped with as many as 10 of such radars for speed control, collision avoidance warning, blind spot detection, parking assistance, and airbag inflation assistance with the ultimate goal of having an intelligent transportation system.

Automotive radars at both 24 GHz and 77 GHz frequency bands have been recently deployed in the luxury cars such as Mercedes Benz, BMW, and Lexus as an option. These radar systems, many of them not scanning arrays, use high cost compound semiconductor technologies and conventional architectures. Therefore, they cost a few thousand dollars, a price unacceptable for most mainstream vehicles.

Surveillance

Embodiments of the present disclosure wafers can be embedded in the battlefield for distributed sensing. embodiments of the present disclosure nodes can image the environment in a collaborative network. Each node can use its beam to image and/or to communicate the information to other nodes. Collaborative sensing is robust to node failures, reconfigurable, secure, power efficient, and achieves higher range and resolution.

The application of embodiments of the present disclosure to any of aforementioned scenarios can require low-cost, low-power consumption from a single source of energy (e.g., solar cell or small battery), high spatial resolution for the scanned beam, and reliability. The choice of frequency(ies) and maximum output power derives from a tradeoff between the required spatial resolution, communication data-rate, and device size in one hand and maximum range on the other hand. For instance, in a 16×16 array where the center frequency is 94 GHz, the total chip area is less than 2.5 cm×2.5 cm and the spatial resolution at a distance of 10 m is roughly 1.5 m. In a wafer scale integration of the same system, an array of 256×256 can be integrated resulting in a spatial resolution of better than 8 cm at 10 m distance. The depth resolution in the imaging scenario and the bit-rate in the communication scenario are inversely proportional and proportional to signal bandwidth, respectively.

Assuming the maximum output power of 10 dBm for each array element in the transmit mode and the element noise figure of 8 dB in the receive mode, instantaneous bandwidth of 100 MHz around 90 GHz, element efficiency of 10%, and minimum received SNR of 10 dB at each element, a 16×16 array can achieve the desired range of 10 m for RADAR and imaging applications. If such a system is used for communication, a maximum data-rate of 11.3 Mbs can be achieved assuming uncorrelated noise at each element. Relatively speaking, to achieve the same beam width (RADAR angular resolution) at 24 GHz, the chip dimensions has to increase by almost a factor of 4, while the range improves by more than a factor of 2. The communication bandwidth is directly proportional to the bandwidth.

Besides direct military applications, in future embodiments of the present disclosure can be transferred to serve in numerous commercial settings including low-cost automotive RADAR, short-range high data-rate (Gbit/sec) WLAN, biomedical imaging, sensory networks in factories for quality-control or for environmental monitoring.

An exemplary embodiment of the present disclosure provides a 4-element phased array chip that uses the variable phase ring oscillator architecture fabricated in a 0.13μ CMOS technology that targets the 24 GHz frequency band.

Figure 12:
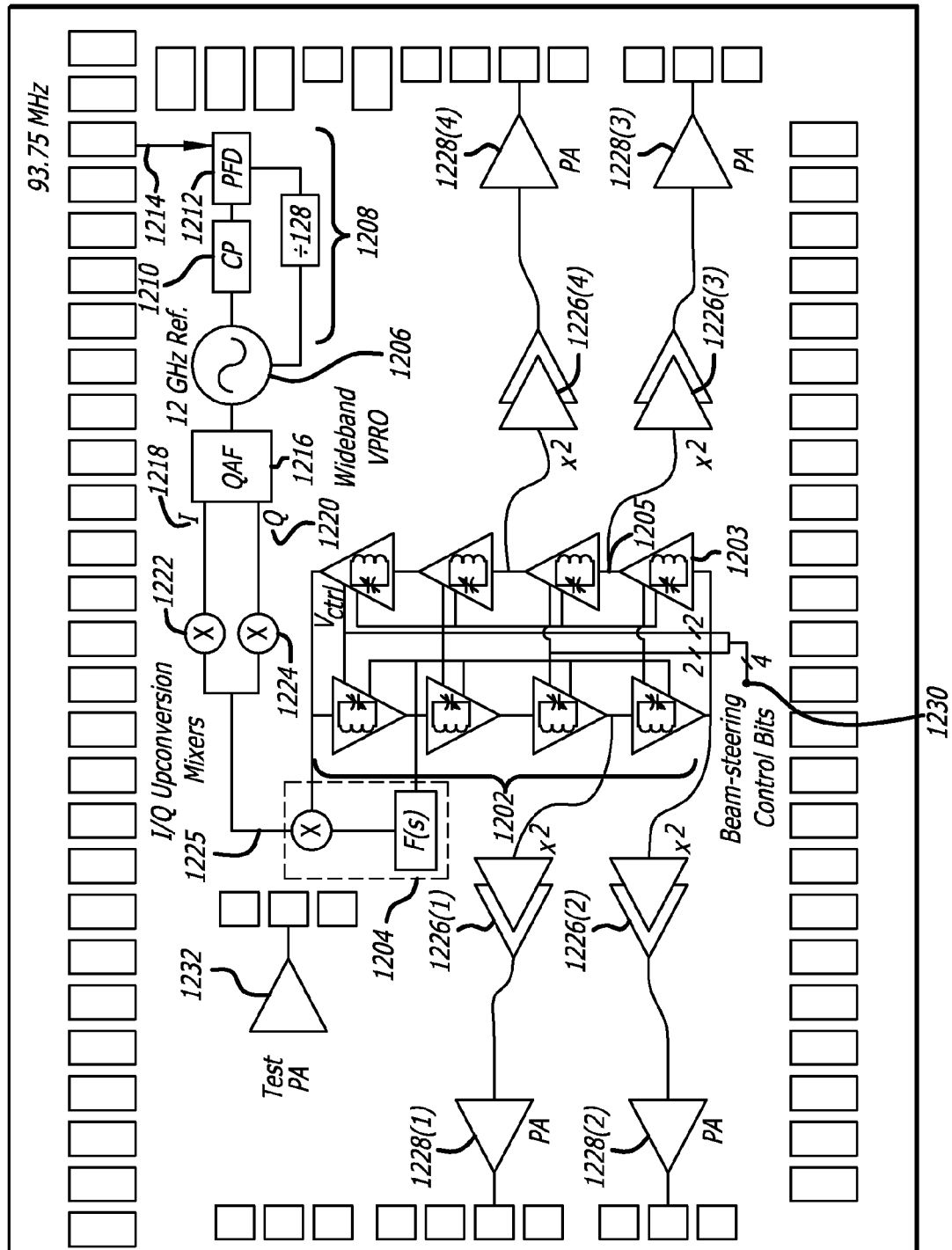
FIG. 12 depicts an ultra-wideband (UWB) VPRO-PLL transmitter phased array architecture overlaid on a chip micrograph of a corresponding integrated circuit, in accordance with an exemplary embodiment.

FIG. 12 depicts an ultra-wideband ("UWB") VPRO-PLL integrated phased array architecture 1200, in accordance with an exemplary embodiment of the present disclosure. The architecture 1200 includes wideband VPRO 1202 connected to a first phase-locked loop 1204. Wideband VPRO 1202 includes eight tuned amplifier stages 1203 connected to four output nodes 1205, e.g., for connection to squarers 1226, power amplifiers (PAs) 1228, and eventually antennas (not shown).

The reference path for the VPRO 1202 includes a first reference signal source 1206 (e.g., an on-chip 12 GHz reference oscillator), which can be locked to a second reference signal source 1214 (e.g., an off-chip, low-frequency reference operational at 93.75 MHz) by a second PLL 1208 (e.g., a divide-by-128 digital PLL).

Figures 13A, 13B:
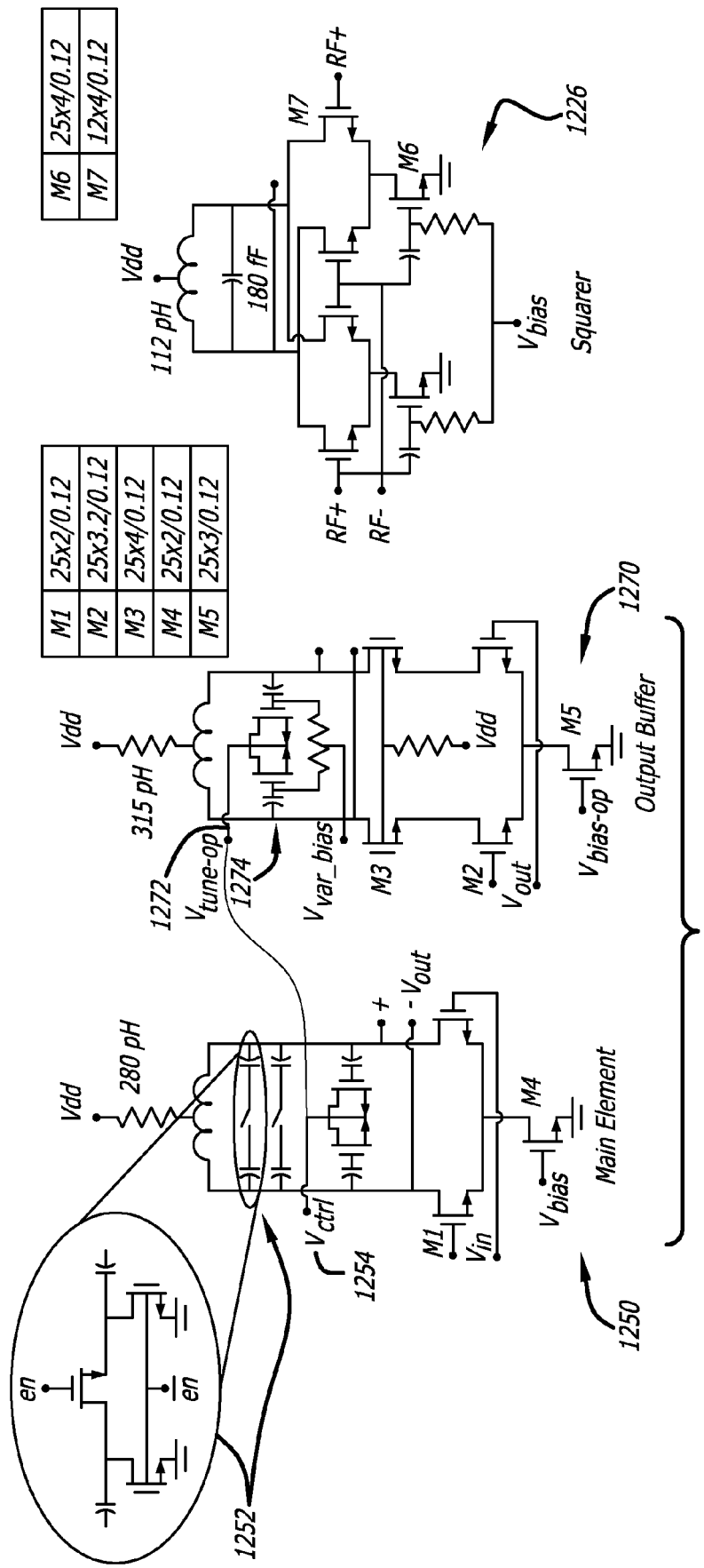
Figure 14A:
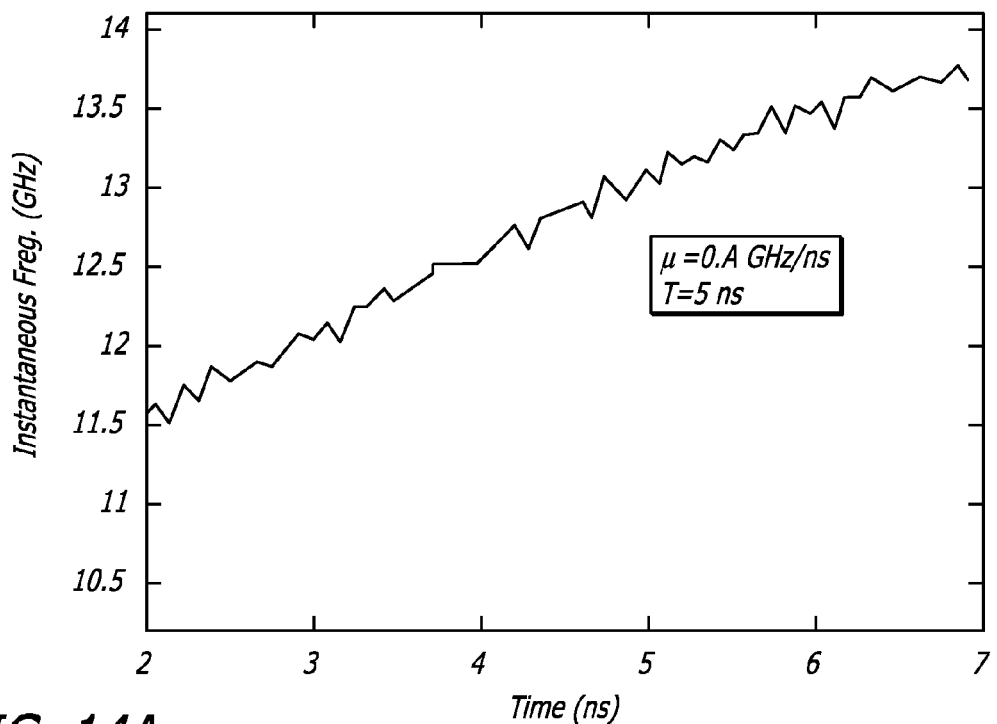
FIG. 14 includes FIGS. 14(a)-14(d), which depict respectively SpectreRF software simulation graphs of (a) instantaneous frequency, (b) instantaneous phase difference between the VPRO node outputs and buffer outputs, (c) instantaneous amplitude of the VPRO node outputs and buffer outputs, and (d) frequency response of the VPRO node outputs and buffer outputs shown for two cases—the buffer's frequency control (i) is connected to that of the VPRO, and (ii) held constant.
Figure 14B:
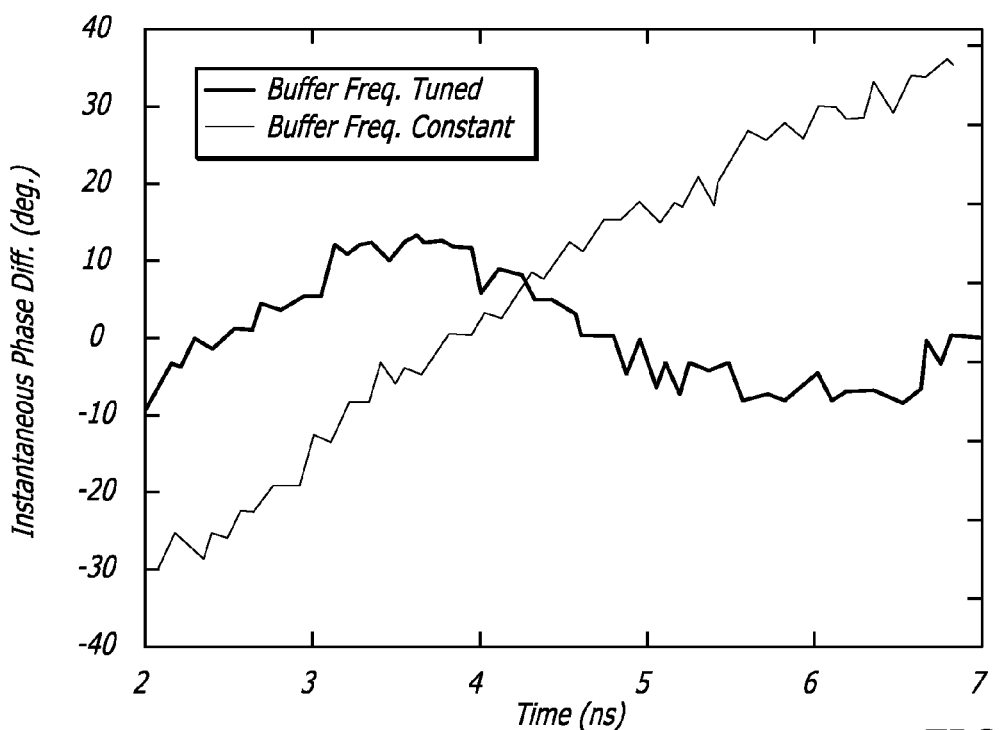
Figure 14C:
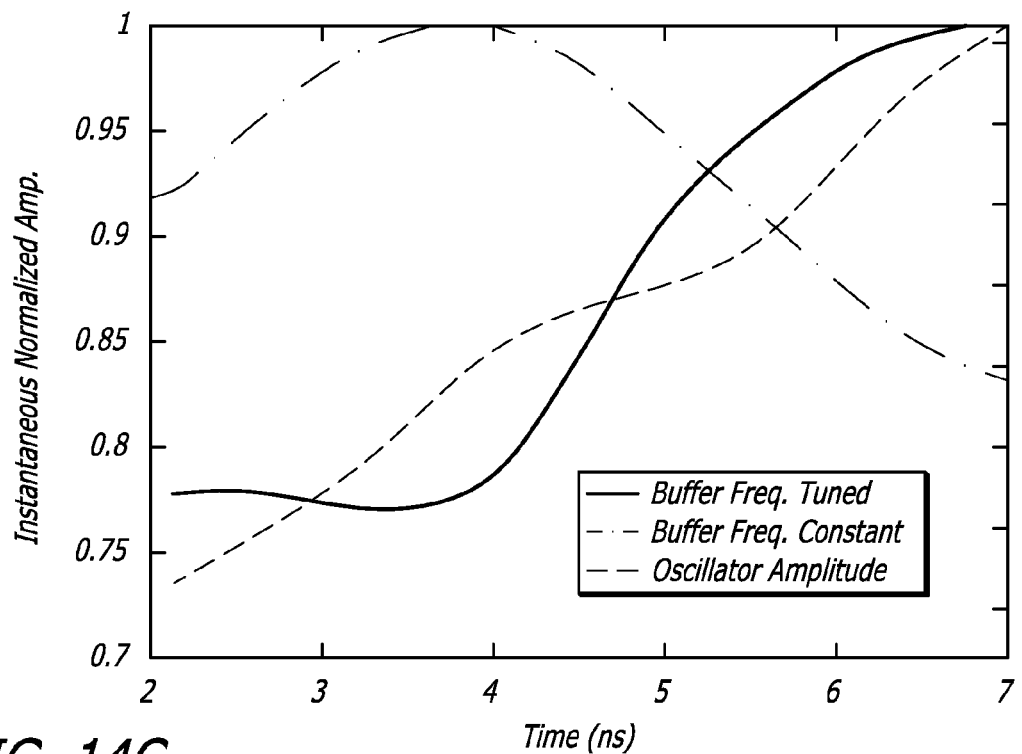
Figure 14D:
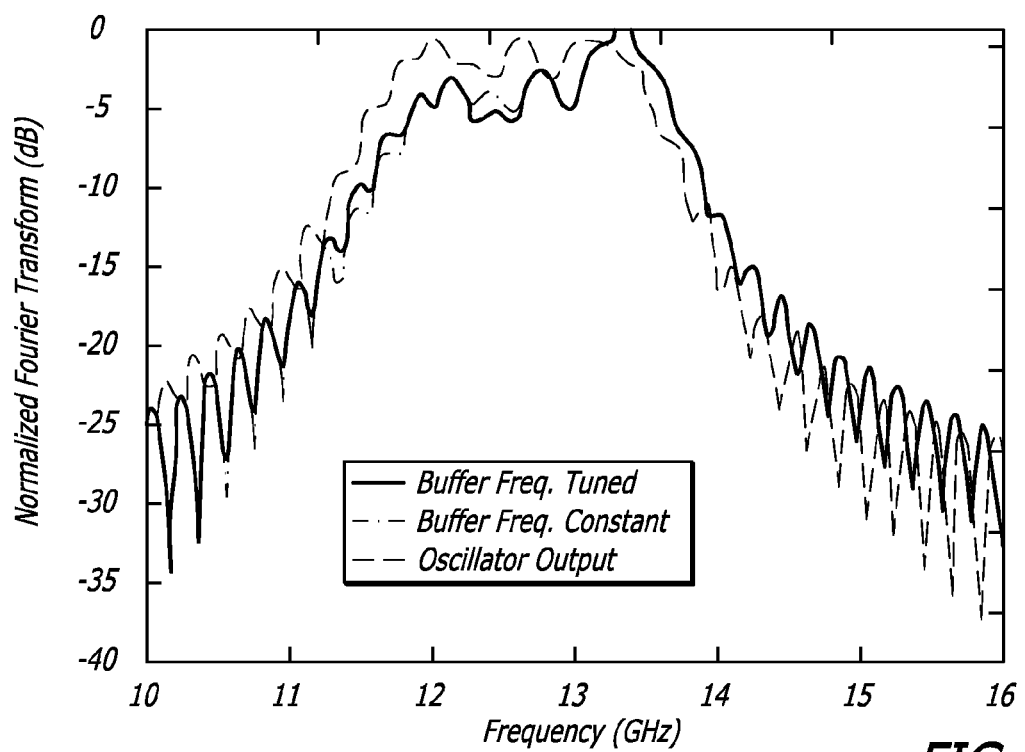

In-phase ("I") and quadrature ("Q") components 1218, 1220 of this reference 1206 are generated by a quadrature all-pass filter 1216 ("QAF") and are mixed (by mixers 1222, 1224) with baseband I and Q inputs to generate the modulated reference signal (denoted by output path 1225). The wideband VPRO 1202, which generates phase-shifted signals for each antenna path, is locked to this modulated UWB reference signal through an analog, high-frequency PLL 1204 with sufficient loop bandwidth for the VPRO to track the UWB reference. The VPRO 1202 functions at half of the desired output frequency range, as will be described in further detail infra, and therefore a squarer 1226(1)-1226(4), designed as a self-mixer (e.g., as shown in FIG. 13b), is interposed between each VPRO output and a corresponding power amplifier (PA) 1228(1)-1228(2) as shown. Also provided is a control 1230 for beam-steering control bits, as described in further detail for FIGS. 13(a)-13(b). A test PA 1232 may also be provided as shown.

As described previously, a VPRO can include a tuned ring oscillator with a phase-shifter introduced into the loop. Since the total phase shift in the loop must add up to 0°, the phase-shifter's extra phase shift must be compensated by the tuned ring elements. The VPRO oscillates off the center-frequency of the tuned loads so that each tuned element sustains a phase shift across itself to compensate for the extra phase-shifter. Thus, an electronically-controllable phase progression is set up across the VPRO nodes, which is the requirement for beam-steering.

An LC tuned load can sustain a phase shift that ranges from −90° to +90°. In a tuned ring oscillator, however, such a range could be subject to practical limitations effectively producing a smaller range, e.g., to −60° to +60°, as large phase shifts can reduce the impedance of each tuned load (and gain) and hence deteriorate start-up, e.g., by producing an overall gain of less than 1. Exemplary embodiments of a VPRO can therefore be operated at half of the desired output frequency range in conjunction with a frequency doubling, e.g., as provided by squarers 1226 in FIG. 12; doubling the frequency through squaring also doubles the inter-element phase shift. If each tuned load provides −45° to +45° of phase shift, squaring increases the range to −90° to +90°. A simple sign-inversion of the differential signals, e.g., as accomplished in the PAs 1228(1)-1228(3) of FIG. 12, increases the range further to −180° to +180°, the complete range preferable for complete angular beam-steering.

Reference Chain and Analog PLL Design: The on-chip 12 GHz reference 1206 shown in FIG. 12 was implemented as a cross-coupled LC oscillator utilizing only pMOS transistors, due to the high nMOS flicker-noise corner. As shown, it 1206 is locked in a divide-by-128, digital PLL 1208, that utilizes static frequency dividers, a standard tri-state phase-frequency detector 1212 and a charge pump 1210. The quadrature all-pass filter 1216 employs a single-stage RC-CR network while the analog PLL 1204 that locks the VPRO 1202 to the modulated reference 1225 uses a three-stage mixer as its phase detector and a first-order RC loop filter. The tracking range of the analog PLL 1204 governs the bandwidth of the chirp waveform that may be generated, while the loop bandwidth governs µ, the rate of the chirp.

With reference again to FIG. 12, for exemplary embodiments, the VPRO 1202 preferably has 1.5 GHz of tuning bandwidth for 24-27 GHz system operation, although the bandwidth preferably is increased beyond 2 GHz to provide margin and ensure a linear tuning characteristic in the desired range. This amount of tuning bandwidth can be significant, given that a large portion of the capacitance budget is used toward phase-shifting.

Regarding fabrication of architecture UWB VPRO-PLL 1200, as depicted in micrograph portion of FIG. 12, the architecture 1200 was implemented in a 0.13 CMOS process with 8 metal layers and no special analog options, such as a thick upper metal layer or MIM capacitors. The chip of the exemplary embodiment shown was built to occupy 2.7 mm×1.8 mm of die area and to draw approximately 750 mA from a 1.5 V supply when all channels are enabled.

FIG. 13(a) depicts the circuit diagram of each element of the wideband VPRO 1202 of FIG. 12, in which, for symmetry purposes, the extra phase-shifter is implemented as 4 additional tuned stages 1203 (e.g., shown by the upper four stages of VPRO 1202 in FIG. 12).

With continuing reference to FIG. 13(a), each stage 1203 can include a main element 1250 and an output buffer 1270. The main element 1250 can be equipped with 2-bit, binary-weighted switched capacitors 1252(1)-1252(2) so that the top- and bottom-four elements 1203 may be detuned to accomplish phase-shifting and hence beam-steering. The feature of the switched capacitors 1252(1)-1252(2), coupled with the 1-bit sign inversion capability incorporated in the PAs (as described in further detail infra), can allow the 4-channel array to achieve 3-bits of beam-steering resolution. Each tuned element 1203 is also equipped with varactors for PLL frequency control, with the size of the varactors preferably chosen to maximize the Quality Factor (Q) and the $$\frac{C_{max}}{C_{min}}$$

capacitor tuning ratio. Representative power ratings for MOSFETS M1-M5, are indicated in the drawing, though others may be used.

FIG. 13(b) depicts a circuit diagram of a squarer 1226 that can be utilized for exemplary embodiments, e.g., of FIG. 12. Squarer 1226 is designed as a self-mixer, as shown. Representative power ratings for MOSFETS M6 and M7, are indicated in the drawing, though others may be used.

Waveform-Adaptive Tunable Narrowband Design Approach: The design of UWB RF blocks is challenging as a large number of passive elements is usually needed to match ports to a desired impedance and achieve a wideband transfer function. An alternative is to design narrowband blocks with low Q, as the bandwidth of an RLC tuned load is inversely proportional to its Q. This can come, however, with the penalty of high loss levels and low gain, or, alternatively, a larger current consumption to main the same gain and power levels.

Accordingly, exemplary embodiments of the present disclosure provide a new UWB design paradigm and architectures that takes advantage of the known shape and characteristics of the waveform(s) being used. UWB VPRO-PLL architectures according to the present disclosure, e.g., of FIGS. 12-13, can generate UWB signals that are phase- or frequency-modulated (such as the linear FM chirp for radar), and the control voltage of the VPRO can be utilized as a measure of the signal's instantaneous frequency. Therefore, the tuned blocks that follow the VPRO, such as the output buffers (e.g., buffer 1270 of FIG. 13), squarers (e.g., squarer 1226 of FIG. 12), and PAs (e.g., PAs 1228 of FIG. 12) may be designed to be high-Q, tunable-narrowband systems, whose center frequency is also controlled by the control voltage. In other words, the transfer function of the RF chain tracks the instantaneous frequency of the signal, achieving wideband performance while being instantaneously narrowband in nature.

Illustrating this high-Q, tunable-narrowband functionality with center frequency controlled by a control voltage, FIGS. 13(*a*)-13(*b*) show the frequency control, achieved through varactors 1274, of the buffer $V_{tune\_op}$ 1272 being connected to the control voltage of the VPRO 1254.

FIG. 14 depicts the result of a simulation (using SpectreRF software, circuit/RF simulation program made available by Cadence Design Systems) of the VPRO and its buffers when the control voltage is linearly ramped with time to produce a chirp.

FIG. 14 includes FIGS. 14(*a*)-14(*d*), which depict respectively SpectreRF software simulation graphs of (a) instantaneous frequency, (b) instantaneous phase difference between the VPRO node outputs and buffer outputs, (c) instantaneous amplitude of the VPRO node outputs and buffer outputs, and (d) frequency response of the VPRO node outputs and buffer outputs shown for two cases—when the buffer's frequency control (i) is connected to that of the VPRO, and (ii) is held constant.

FIG. 14(*a*) shows that a linear ramp in the control voltage results in a linearly increasing instantaneous frequency while FIG. 14(*b*)-(*d*) show how the tuning of the buffers along with the VPRO leads to tracking of amplitudes and phases between the buffer outputs and VPRO node outputs, thus minimizing the distortion between the two in the frequency response. When the buffers are not tracked, significant distortion is introduced between VPRO node outputs and the buffer outputs. This is important as the radar receiver would use an identical VPRO to correlate with the incoming signal, and distortion in the transmitter and receiver front-end circuits reduces the signal-to-noise ratio ("SNR") benefit achieved through matched filtering.

In the exemplary embodiments modeled in FIG. 14 and depicted in FIGS. 12-13, only the buffers are designed to track the VPRO frequency, since the squarers and PAs are capable of supporting the desired bandwidth without a significant gain or power penalty. If a larger bandwidth is desired, the squarers and/or PAs may also be designed as tunable-narrowband systems.

Measurement Results: summaries of measurement results of the fully-integrated 4-channel 24-27 GHz CMOS phased array transmitter prototype shown and described for FIGS. 12-14 are depicted in FIGS. 15-18.

Figure 15:
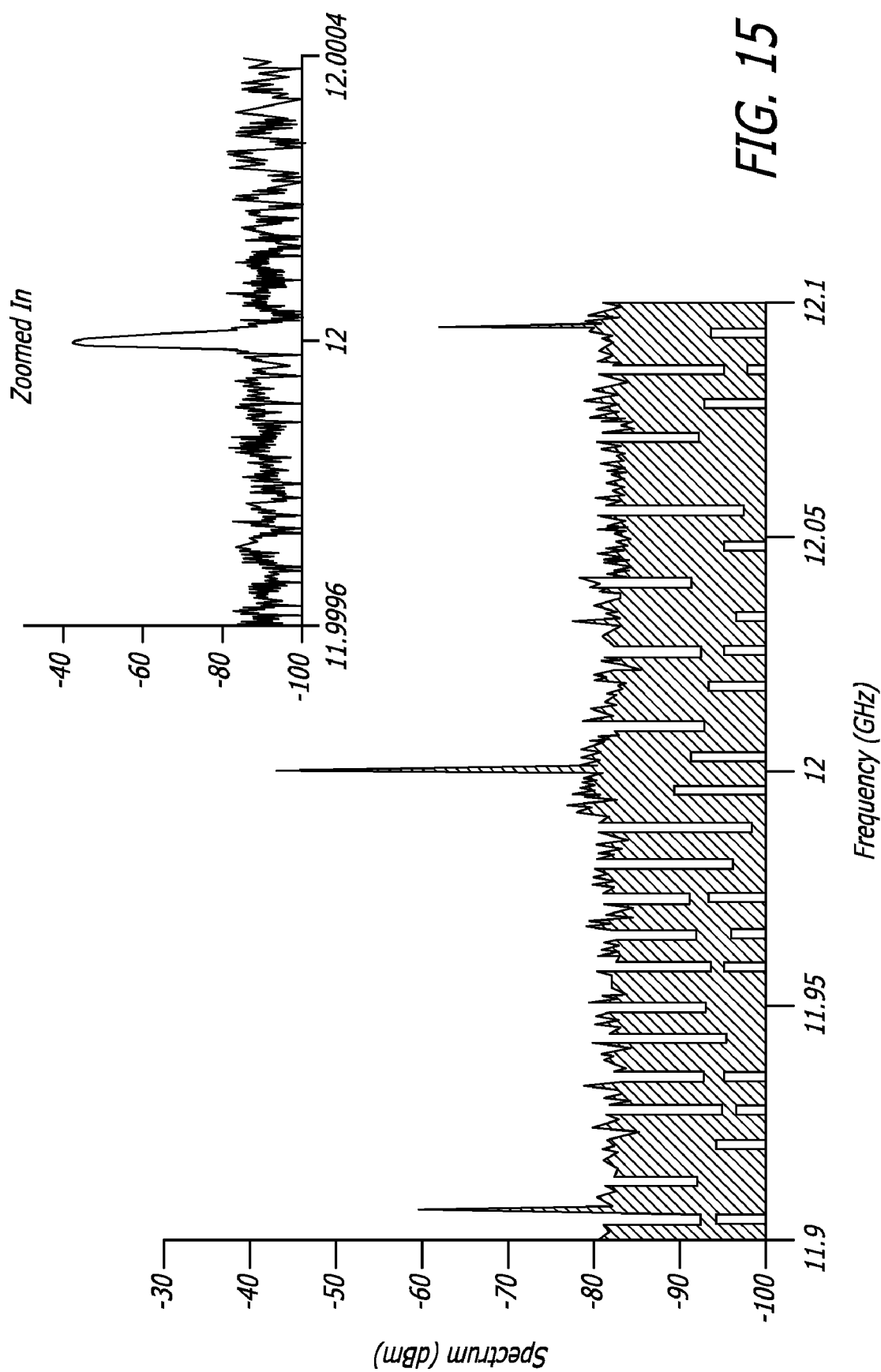
FIG. 15 depicts a graph, with zoomed in inset, of the measured spectrum of a 12 GHz on-chip reference under lock, in accordance with exemplary embodiments of the present disclosure.

FIG. 15 shows the spectrum of the 12 GHz on-chip reference when locked to an external 93.75 MHz reference in the divide-by-128 digital PLL. Spectrum power in dBm is on the ordinate axis and frequency in GHz is on the abscissa axis. An inset is shown of a zoomed in portion of the graph, centered on the 12 GHz frequency.

Figure 16C:
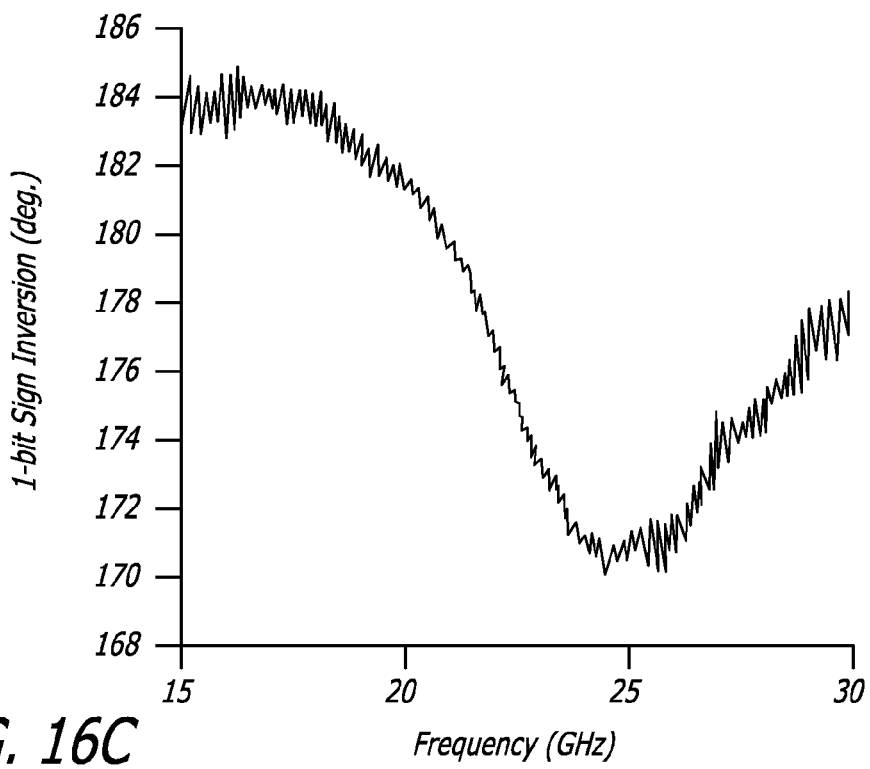
FIG. 16(c) depicts a 1-bit sign inversion of an exemplary embodiment.
Figure 16D:
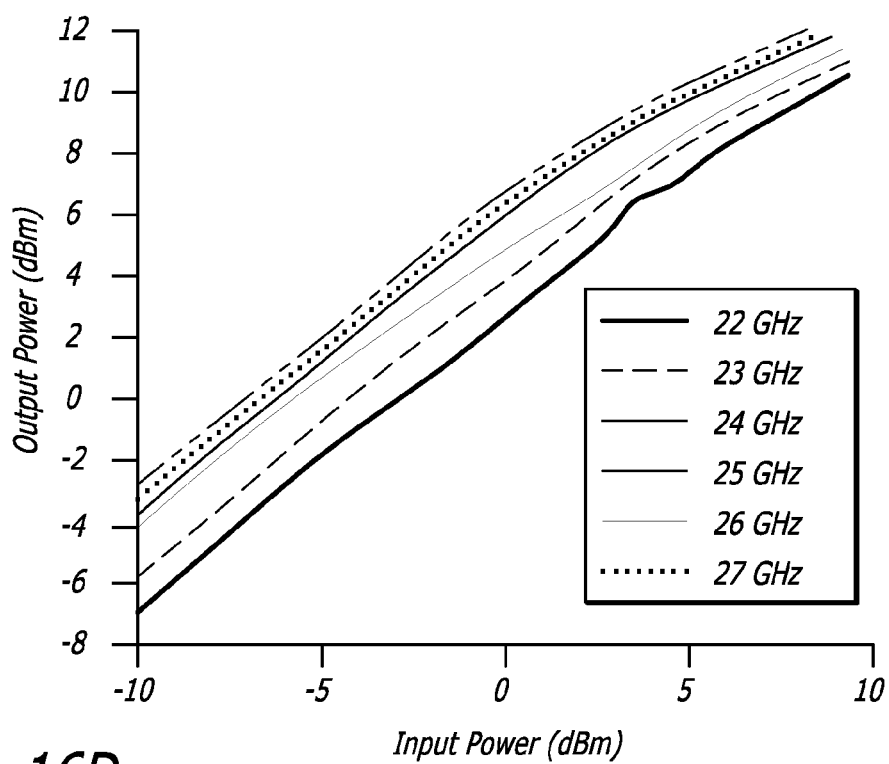
FIG. 16(d) depicts a graph of measured large signal performance of an exemplary embodiment of the present disclosure.

FIG. 16(*a*) depicts a circuit diagram of a power amplifier in accordance with present disclosure; FIG. 16(*b*) depicts a graph of measured small signal parameters for 0/180 paths for an embodiment of the present disclosure; FIG. 16(*c*) depicts a 1-bit sign inversion of an exemplary embodiment; FIG. 16(*d*) depicts a graph of measured large signal performance of an exemplary embodiment of the present disclosure;

The circuit diagram 1600 of the PA of each channel (e.g., PA 1228 of FIG. 12) is presented in FIG. 16(*a*). To achieve 1-bit sign inversion, two differential pairs 1602(1)-1602(2) with inverted inputs are used. Each pair may be enabled through its tail transistor, and the drains of both are tied to each other. A cascode pair configuration can be used or employed for the PA to enhance reverse isolation and both ports can be matched to a suitable differential impedance, e.g., of 100Ω, through lumped inductors.

FIGS. 16(*b*)-(*d*) present the measured PA performance of PAs according to exemplary embodiments, e.g., as shown in FIGS. 12 and 16(*a*). Wideband performance between 24 GHz and 27 GHz is seen for small- and large-signal drive and 1-bit sign inversion is achieved. Each PA draws 88 mA from a 1.5 V supply during linear operation and achieves a saturated output power in excess of 12.1 dBm at 26 GHz, corresponding to a peak drain efficiency greater than 13%.

In order to experimentally validate the beam-steering capability of the prototype, narrowband array patterns are measured at 24.75 GHz with two elements active, assuming half-wavelength antenna separation. The propagation of the transmitted beam in free-space has been emulated using external, variable delay elements, as shown in FIG. 17.

Figure 17:
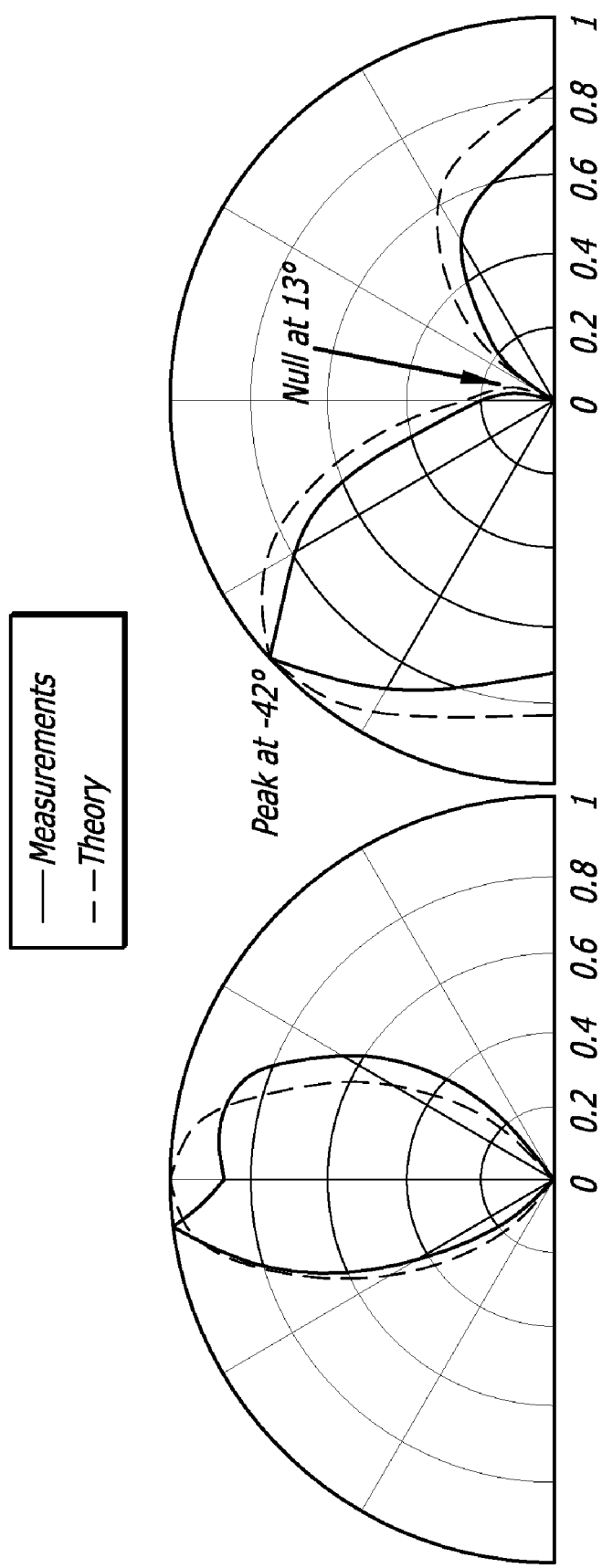
FIG. 17 depicts polar plots of measured 2-element narrowband array patterns at 24.75 GHz in accordance with an exemplary embodiment of the present disclosure.

FIG. 17 shows the results of these measurements for two different settings. To assess UWB beam-steering functionality, wideband FM waveforms of varying bandwidths are generated by direct FM modulation of the VPRO control voltage with a 5 MHz sinusoid of varying amplitude. Once again, two channels are enabled and the transmitted beam in different directions is measured.

Figure 18A:
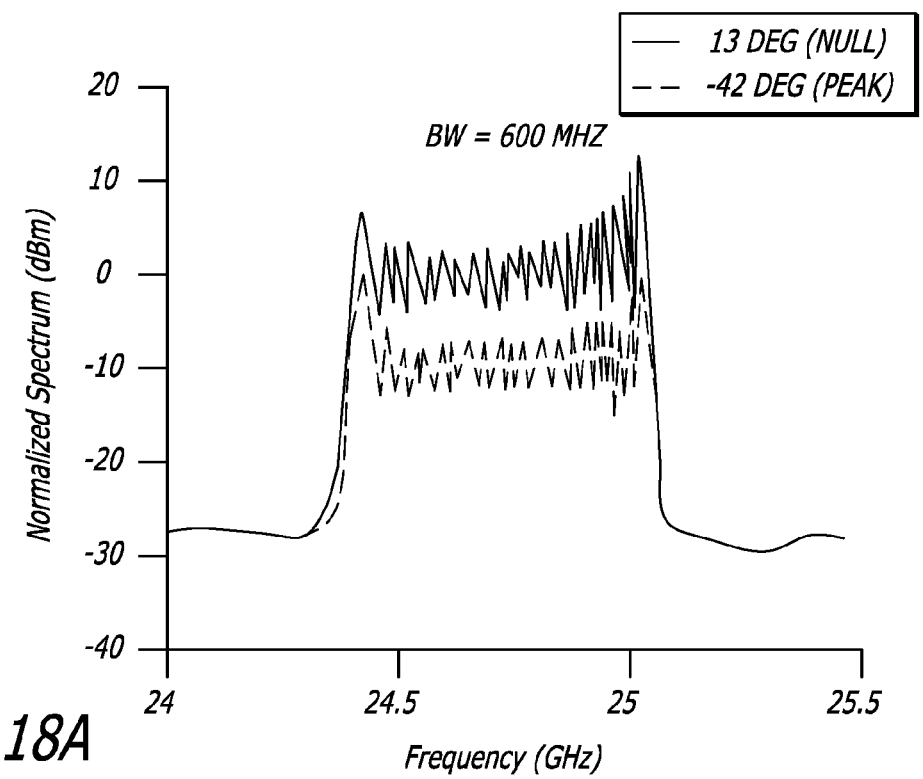
FIG. 18 depicts two plots of measured spectrum of the transmitted UWB FM beam along the expected peak and null directions when the beam is steered to −42 for two active elements and two different signal bandwidths under consideration.
Figure 18B:
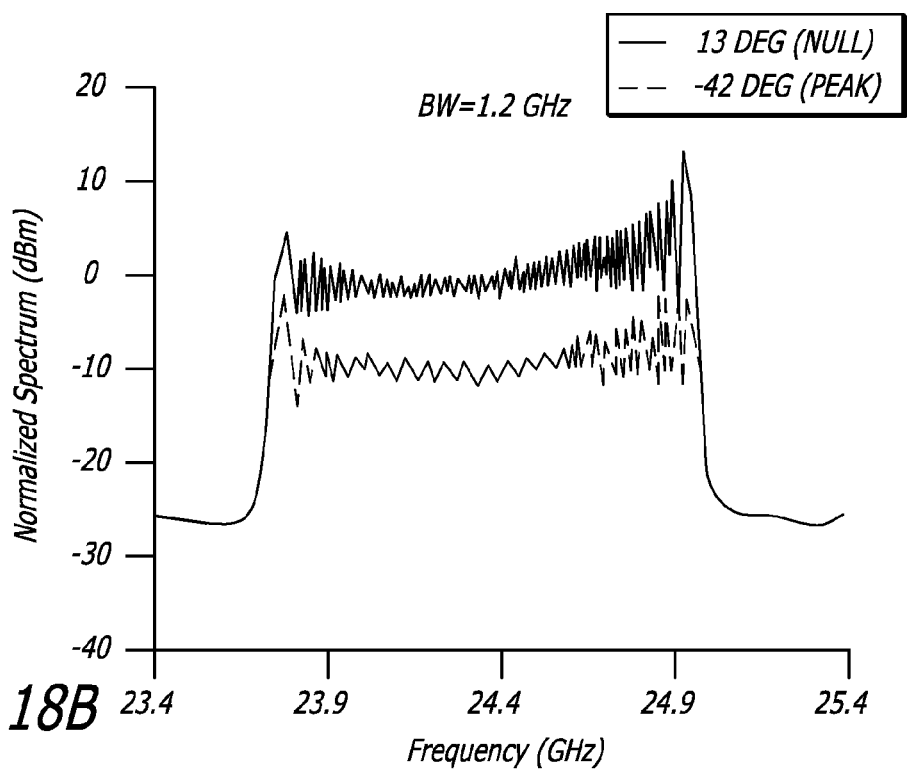

FIG. 18 shows the measured normalized spectrum when the beam is steered to −42° (corresponding to the second narrowband pattern in FIG. 17) for two different signal bandwidths along the expected peak and null directions. Indeed, the power spectral density (PSD) in the null direction is suppressed by approximately 10 dB when compared to the peak direction.

Figure 19:
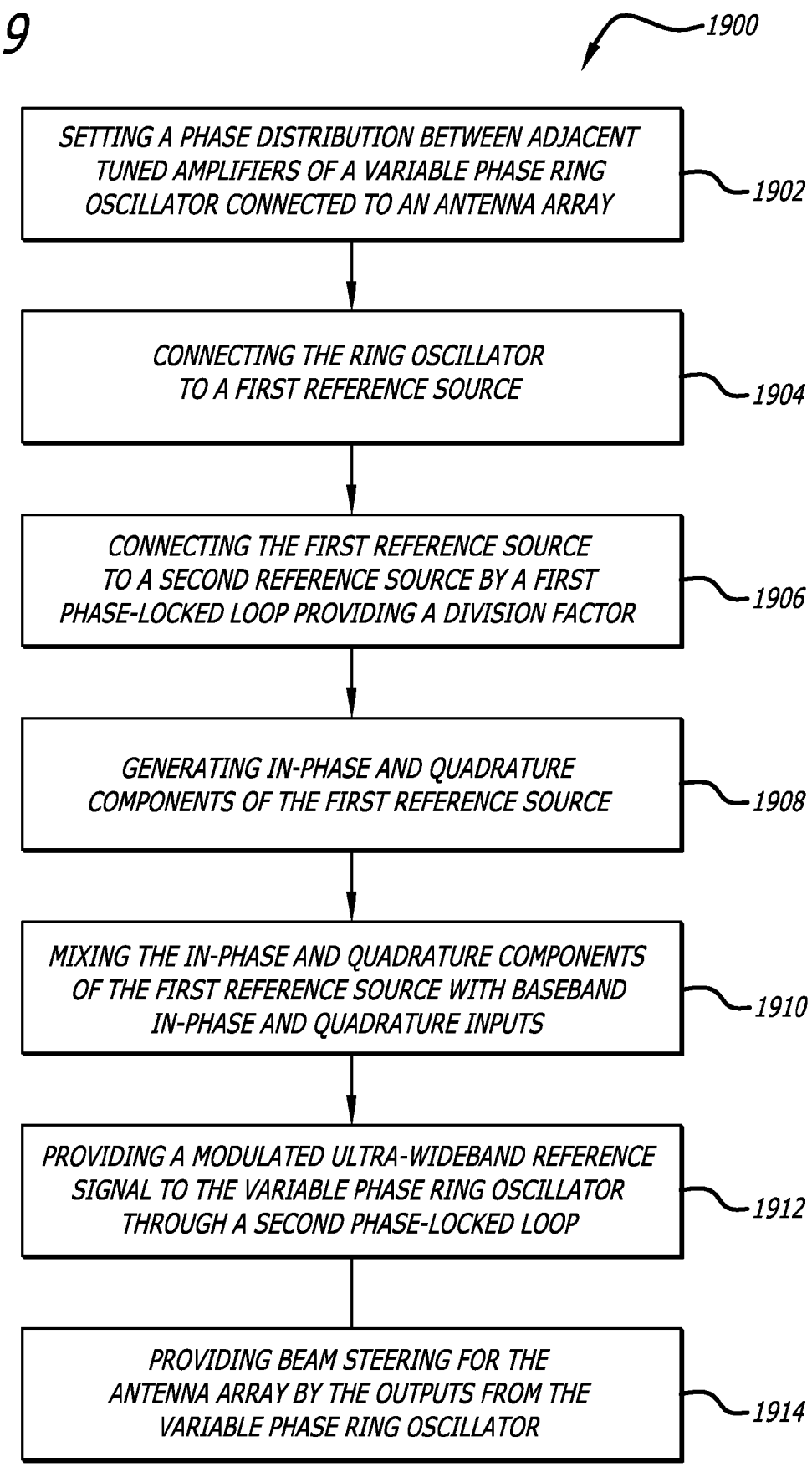
FIG. 19 depicts a further method in accordance with an exemplary embodiment of the present disclosure.

FIG. 19 depicts a method 1900 of providing steerable control of an antenna array, in accordance with an exemplary embodiment of the present disclosure. For method 1900, a phase distribution can be set between adjacent tuned amplifiers of a variable phase ring oscillator (or VPRO) that is connected to an antenna array, as described at 1902. The VPRO can be connected to a first reference source, e.g., 12 GHz oscillator 1206 of FIG. 12, as described at 1904. The first reference source can be connected to a second reference source by a first phase-locked loop providing a division factor (e.g., 128), as described at 1906.

Continuing with the description of method 1900, in-phase and quadrature components can be generated from the first reference source (e.g., by use of quadrature all-pass filter 1216 of FIG. 12), as described at 1908. The in-phase and quadrature components can be mixed with baseband and quadrature inputs to generate a modulated reference signal, as described at 1910. A resulting modulated ultra-wideband reference signal to the variable phase ring oscillator through a second phase locked loop (e.g., PLL 1204 of FIG. 12), as described at 1912. Beam steering for the antenna array can be provided from by outputs from the variable phase ring oscillator, as described at 1914.

Accordingly, exemplary embodiments of the present disclosure can provide a fully-integrated, UWB, multiple channel (e.g., 4-channel) K-band CMOS, phased-array transmitter, related circuits/architectures, and related methods. Such embodiments can be used for transmitter vehicular radar applications, and utilizes the VPRO-PLL architecture, which is extended to UWB capability in exemplary embodiments through architectural and circuit features including, e.g., use of linked PLLs, frequency squarers and bit-inversion for beam steering. Waveform-adaptive, tunable-narrowband designs and structures are provided that can simplify the design/implementation of UWB RF blocks. The architectures can be extended to support pulsed-sinusoidal UWB waveforms, e.g., through the implementation of a fast pulse-shaping switch before or after the PAs. In exemplary embodiments, such architectural innovations result in area-efficient and power-efficient implementations, and coupled with the frequency-handling capability of modern CMOS processes, can provide for the capability and deployment of fully-integrated, high-performance, low-cost, UWB vehicular radar sensors.

Accordingly, embodiments of the present disclosure can provide for novel fully integrated architectures and RF circuits to generate and receive arbitrary two-dimensional beam patterns at single frequency or multiple concurrent frequencies. The present disclosure can provide an active silicon programmable integrated radiator, which as a new class of radiator can be utilized for communication devices, or imaging sensors where the EM at the radiator aperture is actively controlled in a micron scale on a single silicon wafer, resulting in an unprecedented functionality, flexibility, reliability, and cost reduction. The amplitude and phase of the EM field at the aperture of the so-called micro-radiators will be controlled by active silicon devices, namely complementary metal oxide semiconductor field effect transistors (CMOS FET) or silicon germanium hetero-structure bipolar junction transistors (SiGe HBT). In addition to the automotive radar application, exemplary embodiments may be applicable to other high resolution ranging and imaging systems as well as high data-rate wireless communications such as those suitable for wireless local area networks (WLAN).

While certain embodiments have been described herein, it will be understood by one skilled in the art that the methods, systems, and apparatus of the present disclosure may be embodied in other specific forms without departing from the spirit thereof. For example, while arrays including a specific number of elements and/or spacing (e.g., λ/2) have been shown and described, other configurations and embodiments may be used and are within the scope of the present disclosure. Accordingly, the embodiments described herein are to be considered in all respects as illustrative of the present disclosure and not restrictive.

What is claimed is:

1. An ultra-wideband variable-phase ring-oscillator circuit comprising:
   a plurality of tuned amplifiers configured in series as a ring, wherein the ring includes a plurality of output nodes for connection to a plurality of antennas;
   a first phase-locked loop connected to the ring, wherein the first-phased locked loop includes a first phase shifter coupled to the ring, wherein the first phase shifter provides a phase delay between each pair of successive tuned amplifiers; and
   a reference oscillator configured and arranged to produce an output and connected to the first phase-locked loop by a reference path, wherein the reference oscillator is locked to a reference frequency source by a second phase-locked loop having a plurality of static frequency dividers producing a division factor; and
   a plurality of squarers, each connected to a respective output node, and configured and arranged to double the operational frequency of a signal provided by the ring.

2. The circuit of claim 1, further comprising a plurality of power amplifiers, each connected to a respective frequency squarer.

3. The circuit of claim 2, wherein each power amplifier comprises 2-bit binary-weighted switched capacitors.

4. The circuit of claim 3, wherein each power amplifier further comprises two differential pairs.

5. The circuit of claim 4, wherein each power amplifier is configured as a cascode pair.

6. The circuit of claim 1, wherein the reference oscillator is operational at about 12 GHz.

7. The circuit of claim 1, wherein the second phase-locked loop includes a frequency divider providing a division ratio of 128.

8. The circuit of claim 1, further comprising a plurality of antennas coupled to the plurality of output nodes of the tuned amplifiers, wherein the plurality of antennas are configured and arranged as an array.

9. The circuit of claim 8, wherein the plurality of tunable amplifiers and first phase-locked loop are disposed on a semiconductor substrate.

10. The circuit of claim 9, wherein the second phase-locked loop is disposed on the semiconductor substrate.

11. The circuit of claim 9, wherein the plurality of antennas are disposed on the semiconductor substrate.

12. The circuit of claim 8, wherein the antenna array is operational at about 24 GHz to about 27 GHz.

13. The circuit of claim 1, wherein the plurality of tuned amplifiers are configured in a two dimensional m×n array.

14. The circuit of claim 13, further comprising m first phase shifters, each coupled to a separate ring in the m dimension of the m×n array and n second phase shifters, each coupled to a separate ring in the m×n array.

15. A method of providing steerable control of an antenna array, the method comprising:
   setting a phase distribution between adjacent tuned amplifiers of a variable phase ring oscillator that is connected to an antenna array by multiple output nodes;
   connecting the ring oscillator to a first reference source;
   connecting the first reference source to a second reference source by a first phase-locked loop providing a division factor;
   generating in-phase and quadrature components of the first reference source;
   mixing the in-phase and quadrature components of the first reference source with baseband in-phase and quadrature inputs;
   providing a modulated ultra-wideband reference signal to the variable phase ring oscillator through a second phase-locked loop; and
   providing beam steering for the antenna array by outputs from the variable phase ring oscillator.

16. The method claim 15, further comprising determining relative direction from an automobile connected to the antenna array to an object separate from the automobile.

17. The method of claim 15, further comprising doubling the frequency provided at the output nodes.

18. The method of claim 17, wherein doubling the frequency comprises using a squarer including a self-mixer.

19. The method of claim 15, wherein the first reference source provides a reference signal of about 12 GHz.

20. The method of claim 15, further comprising using varactors for frequency control of the tuned amplifiers of the variable phase ring oscillator.

21. The method of claim 20, further comprising using the frequency control for beam steering of the antenna array with 2-bit resolution.

22. The method of claim 15, further comprising using sign inversion for beam steering resolution of the antenna array.

23. The method of claim 22, wherein using sign inversion comprises using two differential pairs with inverted inputs.

24. The method of claim 15, further comprising operating the antenna array at about 24 GHz to about 27 GHz.

* * * * *